United States Patent
Plesski et al.

(10) Patent No.: US 12,463,619 B2
(45) Date of Patent: Nov. 4, 2025

(54) FILTER DEVICE

(71) Applicant: Murata Manufacturing Co., Ltd., Nagaokakyo (JP)

(72) Inventors: Viktor Plesski, Gorgier (CH); Soumya Yandrapalli, Lausanne (CH); Sean McHugh, Santa Barbara, CA (US); Gregory L. Hey-Shipton, Santa Barbara, CA (US); Garrett Williams, San Mateo, CA (US); Ventsislav Yantchev, Sofia (BG); Andrew Guyette, San Mateo, CA (US); Neal Fenzi, Santa Barbara, CA (US); Jesson John, Dublin, CA (US); Bryant Garcia, Mississauga (CA); Robert B. Hammond, Santa Barbara, CA (US); Patrick Turner, San Bruno, CA (US); Douglas Jachowski, Santa Cruz, CA (US); Greg Dyer, Santa Barbara, CA (US); Chris O'Brien, San Diego, CA (US); Andrew Kay, Provo, UT (US); Albert Cardona, Santa Barbara, CA (US); Dylan Kelly, San Diego, CA (US); Wei Yang, Goleta, CA (US); Marie Chantal Mukandatimana, Santa Barbara, CA (US); Luke Myers, Santa Barbara, CA (US)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 617 days.

(21) Appl. No.: 17/842,657

(22) Filed: Jun. 16, 2022

(65) Prior Publication Data
US 2022/0393666 A1 Dec. 8, 2022

Related U.S. Application Data

(63) Continuation of application No. 17/131,348, filed on Dec. 22, 2020, now Pat. No. 12,149,229, which is a
(Continued)

(51) Int. Cl.
H03H 9/56 (2006.01)
H03H 3/02 (2006.01)
(Continued)

(52) U.S. Cl.
CPC ........ H03H 9/568 (2013.01); H03H 9/02015 (2013.01); H03H 9/02031 (2013.01);
(Continued)

(58) Field of Classification Search
CPC .............. H03H 9/568; H03H 9/02015; H03H 9/02031; H03H 9/02062; H03H 9/02228;
(Continued)

(56) References Cited

U.S. PATENT DOCUMENTS

| | | |
|---|---|---|
| 5,204,575 A | 4/1993 | Kanda et al. |
| 5,274,345 A | 12/1993 | Gau |

(Continued)

FOREIGN PATENT DOCUMENTS

| | | |
|---|---|---|
| CN | 113765495 A | 12/2021 |
| JP | H06152299 A | 5/1994 |

(Continued)

OTHER PUBLICATIONS

Machine English Translation of JP2019186655A published on Oct. 24, 2019 (Year: 2019).*

(Continued)

*Primary Examiner* — Jorge L Salazar, Jr.
(74) *Attorney, Agent, or Firm* — ARENTFOX SCHIFF LLP

(57) ABSTRACT

Filter devices are disclosed. A filter device includes a piezoelectric plate comprising a supported portion, a first
(Continued)

diaphragm, and a second diaphragm. The supported portion is attached to a substrate and the first and second diaphragms spans respective cavities in the substrate. A first interdigital transducer (IDT) has interleaved fingers on the first diaphragm. A second interdigital transducer (IDT) has interleaved fingers on the second diaphragm. A first dielectric layer is between the interleaved fingers of the first IDT, and a second dielectric layer is between the interleaved fingers of the second IDT. A thickness of the first dielectric layer is greater than a thickness of the second dielectric layer. The piezoelectric plate and the first and second IDTs are configured such that radio frequency signals applied to first and second IDTs excite primary shear acoustic modes in the respective diaphragms.

19 Claims, 21 Drawing Sheets

Related U.S. Application Data continuation of application No. 16/924,108, filed on Jul. 8, 2020, now Pat. No. 10,992,284, which is a continuation-in-part of application No. 16/689,707, filed on Nov. 20, 2019, now Pat. No. 10,917,070, which is a continuation of application No. 16/230,443, filed on Dec. 21, 2018, now Pat. No. 10,491,192, application No. 17/842,657 is a continuation-in-part of application No. 17/317,754, filed on May 11, 2021, now Pat. No. 11,870,424, which is a continuation of application No. 17/109,812, filed on Dec. 2, 2020, now Pat. No. 11,967,945, which is a continuation-in-part of application No. 16/689,707, filed on Nov. 20, 2019, now Pat. No. 10,917,070, which is a continuation of application No. 16/230,443, filed on Dec. 21, 2018, now Pat. No. 10,491,192, application No. 17/842,657 is a continuation-in-part of application No. 17/542,295, filed on Dec. 3, 2021, now Pat. No. 12,212,306, which is a continuation-in-part of application No. 17/351,201, filed on Jun. 17, 2021, now Pat. No. 11,876,498, which is a continuation of application No. 16/988,213, filed on Aug. 7, 2020, now Pat. No. 11,201,601, which is a continuation-in-part of application No. 16/438,121, filed on Jun. 11, 2019, now Pat. No. 10,756,697, which is a continuation-in-part of application No. 16/230,443, filed on Dec. 21, 2018, now Pat. No. 10,491,192, application No. 17/842,657 is a continuation-in-part of application No. 17/125,960, filed on Dec. 17, 2020, now Pat. No. 11,949,402, and a continuation-in-part of application No. 17/134,213, filed on Dec. 25, 2020, now Pat. No. 12,021,496, and a continuation-in-part of application No. 17/097,238, filed on Nov. 13, 2020, now Pat. No. 11,955,952, which is a continuation of application No. 16/727,304, filed on Dec. 26, 2019, now Pat. No. 10,917,072, application No. 17/842,657 is a continuation-in-part of application No. 17/189,246, filed on Mar. 1, 2021, now Pat. No. 11,916,539, and a continuation-in-part of application No. 17/109,848, filed on Dec. 2, 2020, now Pat. No. 12,034,428, which is a continuation of application No. 17/030,050, filed on Sep. 23, 2020, now Pat. No. 10,985,728, which is a continuation-in-part of application No. 16/920,173, filed on Jul. 2, 2020, now Pat. No. 11,139,794, which is a continuation of application No. 16/438,121, filed on Jun. 11, 2019, now Pat. No. 10,756,697, which is a continuation-in-part of application No. 16/230,443, filed on Dec. 21, 2018, now Pat. No. 10,491,192, application No. 17/842,657 is a continuation-in-part of application No. 17/122,977, filed on Dec. 15, 2020, now Pat. No. 11,509,279, and a continuation-in-part of application No. 17/133,857, filed on Dec. 24, 2020, now Pat. No. 11,996,825, which is a continuation-in-part of application No. 17/070,694, filed on Oct. 14, 2020, now Pat. No. 11,329,628, application No. 17/842,657 is a continuation-in-part of application No. 17/520,689, filed on Nov. 7, 2021, now Pat. No. 12,028,049, which is a continuation-in-part of application No. 17/189,246, filed on Mar. 1, 2021, now Pat. No. 11,916,539, application No. 17/842,657 is a continuation-in-part of application No. 17/706,154, filed on Mar. 28, 2022, which is a continuation of application No. 17/022,048, filed on Sep. 15, 2020, now Pat. No. 11,349,452, which is a continuation of application No. 16/924,105, filed on Jul. 8, 2020, now Pat. No. 10,868,513, which is a continuation-in-part of application No. 16/829,617, filed on Mar. 25, 2020, now Pat. No. 10,868,512, which is a continuation of application No. 16/578,811, filed on Sep. 23, 2019, now Pat. No. 10,637,438, which is a continuation-in-part of application No. 16/230,443, filed on Dec. 21, 2018, now Pat. No. 10,491,192, application No. 17/842,657 is a continuation-in-part of application No. 17/408,264, filed on Aug. 20, 2021, now Pat. No. 12,113,512, and a continuation-in-part of application No. 17/460,077, filed on Aug. 27, 2021, now Pat. No. 12,155,371, and a continuation-in-part of application No. 17/588,803, filed on Jan. 13, 2022, now Pat. No. 12,155,374.

(60) Provisional application No. 62/685,825, filed on Jun. 15, 2018, provisional application No. 62/701,363, filed on Jul. 20, 2018, provisional application No. 62/741,702, filed on Oct. 5, 2018, provisional application No. 62/748,883, filed on Oct. 22, 2018, provisional application No. 62/753,815, filed on Oct. 31, 2018, provisional application No. 63/228,990, filed on Aug. 3, 2021, provisional application No. 62/892,980, filed on Aug. 28, 2019, provisional application No. 62/904,152, filed on Sep. 23, 2019, provisional application No. 63/087,792, filed on Oct. 5, 2020, provisional application No. 63/072,595, filed on Aug. 31, 2020, provisional application No. 62/865,798, filed on Jun. 24, 2019, provisional application No. 62/983,403, filed on Feb. 28, 2020, provisional application No. 62/904,233, filed on Sep. 23, 2019, provisional application No. 63/053,584, filed on Jul. 18, 2020, provisional application No. 63/088,344, filed on Oct. 6, 2020, provisional application No. 63/040,440, filed on Jun. 17, 2020, provisional application No. 63/167,510, filed on Mar. 29, 2021, provisional application No. 63/167,506, filed on Mar. 29, 2021, provisional application No. 63/169,875, filed on Apr. 2, 2021.

(51) Int. Cl.
*H03H 9/02* (2006.01)
*H03H 9/13* (2006.01)
*H03H 9/17* (2006.01)
*H10N 30/87* (2023.01)

(52) U.S. Cl.
CPC .... *H03H 9/02062* (2013.01); *H03H 9/02228* (2013.01); *H03H 9/132* (2013.01); *H03H 9/174* (2013.01); *H03H 9/176* (2013.01); *H03H 9/562* (2013.01); *H03H 9/564* (2013.01); *H03H 3/02* (2013.01); *H03H 2003/023* (2013.01); *H03H 9/02039* (2013.01); H10N 30/877 (2023.02)

(58) Field of Classification Search
CPC ........ H03H 9/132; H03H 9/174; H03H 9/176; H03H 9/562; H03H 9/564; H03H 3/02; H03H 9/02039; H03H 2003/023; H03H 3/10; H03H 2003/0442; H03H 9/6483; H10N 30/877
USPC .......................... 333/133, 186–188, 193–196
See application file for complete search history.

(56) References Cited

U.S. PATENT DOCUMENTS

| | | |
|---|---|---|
| 5,446,330 A | 8/1995 | Eda et al. |
| 5,552,655 A | 9/1996 | Stokes et al. |
| 5,726,610 A | 3/1998 | Allen et al. |
| 5,729,186 A | 3/1998 | Seki et al. |
| 5,853,601 A | 12/1998 | Krishaswamy |
| 6,172,582 B1 | 1/2001 | Hickernell |
| 6,271,617 B1 | 8/2001 | Yoneda et al. |
| 6,377,140 B1 | 4/2002 | Ehara et al. |
| 6,516,503 B1 | 2/2003 | Ikada et al. |
| 6,540,827 B1 | 4/2003 | Levy et al. |
| 6,570,470 B2 | 5/2003 | Maehara et al. |
| 6,707,229 B1 | 3/2004 | Martin |
| 6,710,514 B2 | 3/2004 | Ikada et al. |
| 6,833,774 B2 | 12/2004 | Abbott et al. |
| 7,009,468 B2 | 3/2006 | Kadota et al. |
| 7,042,132 B2 | 5/2006 | Bauer et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 7,965,015 B2 | 6/2011 | Tai et al. |
| 8,278,802 B1 | 10/2012 | Lee et al. |
| 8,294,330 B1 | 10/2012 | Abbott et al. |
| 8,344,815 B2 | 1/2013 | Yamanaka et al. |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,112,134 B2 | 8/2015 | Takahashi |
| 9,130,145 B2 | 9/2015 | Martin et al. |
| 9,148,121 B2 | 9/2015 | Inoue |
| 9,219,466 B2 | 12/2015 | Meltaus et al. |
| 9,240,768 B2 | 1/2016 | Nishihara et al. |
| 9,276,557 B1 | 3/2016 | Nordquist et al. |
| 9,369,105 B1 | 6/2016 | Li et al. |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,476,469 B2 | 11/2019 | Gong et al. |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,812,048 B2 | 10/2020 | Nosaka |
| 10,819,309 B1 | 10/2020 | Turner et al. |
| 10,826,462 B2 | 11/2020 | Plesski et al. |
| 10,868,510 B2 | 12/2020 | Yantchev et al. |
| 10,868,512 B2 | 12/2020 | Garcia et al. |
| 10,868,513 B2 | 12/2020 | Yantchev |
| 10,911,017 B2 | 2/2021 | Plesski |
| 10,911,021 B2 | 2/2021 | Turner et al. |
| 10,911,023 B2 | 2/2021 | Turner |
| 10,917,070 B2 | 2/2021 | Plesski et al. |
| 10,917,072 B2 | 2/2021 | McHugh et al. |
| 10,985,726 B2 | 4/2021 | Plesski |
| 10,985,728 B2 | 4/2021 | Plesski et al. |
| 10,985,730 B2 | 4/2021 | Garcia |
| 10,992,282 B1 | 4/2021 | Plesski et al. |
| 10,992,283 B2 | 4/2021 | Plesski et al. |
| 10,992,284 B2 | 4/2021 | Yantchev |
| 10,998,877 B2 | 5/2021 | Turner et al. |
| 10,998,882 B2 | 5/2021 | Yantchev et al. |
| 11,003,971 B2 | 5/2021 | Plesski et al. |
| 11,114,996 B2 | 9/2021 | Plesski et al. |
| 11,114,998 B2 | 9/2021 | Garcia et al. |
| 11,139,794 B2 | 10/2021 | Plesski et al. |
| 11,143,561 B2 | 10/2021 | Plesski |
| 11,146,231 B2 | 10/2021 | Plesski |
| 11,146,232 B2 | 10/2021 | Yandrapalli et al. |
| 11,146,238 B2 | 10/2021 | Hammond et al. |
| 11,146,244 B2 | 10/2021 | Yantchev |
| 11,165,407 B2 | 11/2021 | Yantchev |
| 11,171,629 B2 | 11/2021 | Turner |
| 11,201,601 B2 | 12/2021 | Yantchev et al. |
| 11,206,009 B2 | 12/2021 | Plesski |
| 11,228,296 B2 | 1/2022 | Dyer |
| 11,239,816 B1 | 2/2022 | McHugh |
| 11,239,822 B2 | 2/2022 | Garcia |
| 11,264,966 B2 | 3/2022 | Yantchev |
| 11,264,969 B1 | 3/2022 | Fenzi |
| 11,271,539 B1 | 3/2022 | Yantchev |
| 11,271,540 B1 | 3/2022 | Yantchev |
| 11,283,424 B2 | 3/2022 | Turner |
| 11,309,865 B1 | 4/2022 | Guyette |
| 11,323,089 B2 | 5/2022 | Turner |
| 11,323,090 B2 | 5/2022 | Garcia |
| 11,323,091 B2 | 5/2022 | Kay |
| 11,323,095 B2 | 5/2022 | Garcia |
| 11,323,096 B2 | 5/2022 | Yantchev |
| 11,349,450 B2 | 5/2022 | Yantchev |
| 11,349,452 B2 | 5/2022 | Yantchev |
| 11,356,077 B2 | 6/2022 | Garcia |
| 11,368,139 B2 | 6/2022 | Garcia |
| 11,374,549 B2 | 6/2022 | Yantchev |
| 11,381,221 B2 | 7/2022 | McHugh |
| 11,418,167 B2 | 8/2022 | Garcia |
| 2002/0079986 A1 | 6/2002 | Ruby et al. |
| 2002/0130736 A1 | 9/2002 | Mukai |
| 2002/0158714 A1 | 10/2002 | Kaitila et al. |
| 2002/0189062 A1 | 12/2002 | Lin et al. |
| 2003/0042998 A1 | 3/2003 | Edmonson |
| 2003/0080831 A1 | 5/2003 | Naumenko et al. |
| 2003/0199105 A1 | 10/2003 | Kub et al. |
| 2004/0041496 A1 | 3/2004 | Imai et al. |
| 2004/0100164 A1 | 5/2004 | Murata |
| 2004/0261250 A1 | 12/2004 | Kadota et al. |
| 2005/0077982 A1 | 4/2005 | Funasaka |
| 2005/0099091 A1 | 5/2005 | Mishima et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0152107 A1 | 7/2006 | Tanaka |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2007/0278898 A1 | 12/2007 | Miura et al. |

(56) References Cited

U.S. PATENT DOCUMENTS

| | | |
|---|---|---|
| 2008/0246559 A1 | 10/2008 | Ayazi |
| 2010/0019866 A1 | 1/2010 | Hara et al. |
| 2010/0064492 A1 | 3/2010 | Tanaka |
| 2010/0123367 A1 | 5/2010 | Tai et al. |
| 2010/0223999 A1 | 9/2010 | Onoe |
| 2010/0301703 A1 | 12/2010 | Chen et al. |
| 2011/0018389 A1 | 1/2011 | Fukano et al. |
| 2011/0018654 A1 | 1/2011 | Bradley et al. |
| 2011/0102107 A1 | 5/2011 | Onzuka |
| 2011/0109196 A1 | 5/2011 | Goto et al. |
| 2011/0254406 A1 | 10/2011 | Yamane |
| 2011/0278993 A1 | 11/2011 | Iwamoto |
| 2012/0073390 A1 | 3/2012 | Zaghloul et al. |
| 2012/0198672 A1 | 8/2012 | Ueda et al. |
| 2012/0286900 A1 | 11/2012 | Kadota et al. |
| 2012/0326809 A1 | 12/2012 | Tsuda |
| 2013/0127551 A1 | 5/2013 | Yamanaka |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0321100 A1 | 12/2013 | Wang |
| 2014/0009032 A1 | 1/2014 | Takahashi et al. |
| 2014/0113571 A1 | 4/2014 | Fujiwara et al. |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0014795 A1 | 1/2015 | Franosch |
| 2015/0042417 A1 | 2/2015 | Onodera et al. |
| 2015/0165479 A1 | 6/2015 | Lasiter et al. |
| 2015/0319537 A1 | 11/2015 | Perois et al. |
| 2015/0333730 A1 | 11/2015 | Meltaus et al. |
| 2015/0365067 A1 | 12/2015 | Hori et al. |
| 2016/0028367 A1 | 1/2016 | Shealy |
| 2016/0079958 A1 | 3/2016 | Burak |
| 2016/0087187 A1 | 3/2016 | Burak |
| 2016/0149554 A1 | 5/2016 | Nakagawa |
| 2016/0182009 A1 | 6/2016 | Bhattacharjee |
| 2016/0285430 A1 | 9/2016 | Kikuchi et al. |
| 2017/0063332 A1 | 3/2017 | Gilbert et al. |
| 2017/0179225 A1 | 6/2017 | Kishimoto |
| 2017/0179928 A1 | 6/2017 | Raihn et al. |
| 2017/0187352 A1 | 6/2017 | Omura |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0264266 A1 | 9/2017 | Kishimoto |
| 2017/0290160 A1 | 10/2017 | Takano et al. |
| 2017/0370791 A1 | 12/2017 | Nakamura et al. |
| 2018/0005950 A1 | 1/2018 | Watanabe |
| 2018/0013405 A1 | 1/2018 | Takata |
| 2018/0026603 A1 | 1/2018 | Iwamoto |
| 2018/0033952 A1 | 2/2018 | Yamamoto |
| 2018/0041191 A1 | 2/2018 | Park |
| 2018/0062615 A1 | 3/2018 | Kato et al. |
| 2018/0062617 A1 | 3/2018 | Yun et al. |
| 2018/0123016 A1 | 5/2018 | Gong |
| 2018/0152169 A1 | 5/2018 | Goto et al. |
| 2018/0191322 A1 | 7/2018 | Chang et al. |
| 2018/0262179 A1 | 9/2018 | Goto |
| 2018/0278227 A1 | 9/2018 | Hurwitz |
| 2018/0309426 A1 | 10/2018 | Guenard |
| 2018/0316333 A1 | 11/2018 | Nakamura et al. |
| 2019/0007022 A1 | 1/2019 | Goto et al. |
| 2019/0044498 A1 | 2/2019 | Kawasaki |
| 2019/0068155 A1 | 2/2019 | Kimura et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0181833 A1 | 6/2019 | Nosaka |
| 2019/0190487 A1 | 6/2019 | Yasuda |
| 2019/0207583 A1 | 7/2019 | Miura et al. |
| 2019/0245518 A1 | 8/2019 | Ito |
| 2019/0253038 A1 | 8/2019 | Houlden |
| 2019/0273480 A1 | 9/2019 | Lin et al. |
| 2019/0341911 A1 | 11/2019 | Komatsu et al. |
| 2019/0348966 A1 | 11/2019 | Campanella-Pineda |
| 2019/0379351 A1 | 12/2019 | Miyamoto et al. |
| 2019/0386635 A1 | 12/2019 | Plesski et al. |
| 2019/0386636 A1 | 12/2019 | Plesski et al. |
| 2019/0386638 A1 | 12/2019 | Kimura et al. |
| 2020/0007110 A1 | 1/2020 | Konaka et al. |
| 2020/0021272 A1 | 1/2020 | Segovia Fernandez et al. |
| 2020/0036357 A1 | 1/2020 | Mimura |
| 2020/0083861 A1 | 3/2020 | Matsuo |
| 2020/0228087 A1 | 7/2020 | Michigami et al. |
| 2020/0235719 A1 | 7/2020 | Yantchev et al. |
| 2020/0244247 A1 | 7/2020 | Maeda |
| 2020/0259480 A1 | 8/2020 | Pensala |
| 2020/0274520 A1 | 8/2020 | Shin |
| 2020/0304091 A1 | 9/2020 | Yantchev |
| 2020/0313645 A1 | 10/2020 | Caron |
| 2020/0321939 A1 | 10/2020 | Turner et al. |
| 2020/0328728 A1 | 10/2020 | Nakagawa et al. |
| 2020/0350891 A1 | 11/2020 | Turner |
| 2021/0013859 A1 | 1/2021 | Turner et al. |
| 2021/0152154 A1 | 5/2021 | Tang |
| 2021/0265978 A1 | 8/2021 | Plesski et al. |
| 2021/0273631 A1 | 9/2021 | Jachowski et al. |
| 2021/0313951 A1 | 10/2021 | Yandrapalli et al. |
| 2021/0328574 A1 | 10/2021 | Garcia |
| 2021/0351762 A1 | 11/2021 | Dyer et al. |
| 2022/0052669 A1 | 2/2022 | Schäufele et al. |
| 2022/0103160 A1 | 3/2022 | Jachowski et al. |
| 2022/0116014 A1 | 4/2022 | Poirel |
| 2022/0116015 A1 | 4/2022 | Garcia et al. |
| 2022/0123720 A1 | 4/2022 | Garcia et al. |
| 2022/0123723 A1 | 4/2022 | Garcia et al. |
| 2022/0149808 A1 | 5/2022 | Dyer et al. |
| 2022/0149814 A1 | 5/2022 | Garcia et al. |

FOREIGN PATENT DOCUMENTS

| | | |
|---|---|---|
| JP | 2002300003 A | 10/2002 |
| JP | 2004096677 A | 3/2004 |
| JP | 2007329584 A | 12/2007 |
| JP | 2010062816 A | 3/2010 |
| JP | 2010233210 A | 10/2010 |
| JP | 2012049758 A | 3/2012 |
| JP | 2013214954 A | 10/2013 |
| JP | 2018093487 A | 6/2018 |
| JP | 2018166259 A | 10/2018 |
| JP | 2018207144 A | 12/2018 |
| JP | 2019186655 A * | 10/2019 |
| JP | 2020113939 A | 7/2020 |
| WO | 2013128636 A1 | 9/2013 |
| WO | 2015098694 A1 | 7/2015 |
| WO | 2016017104 | 2/2016 |
| WO | 2016052129 A1 | 4/2016 |
| WO | 2016147687 A1 | 9/2016 |
| WO | 2018003273 | 1/2018 |
| WO | 2018163860 A1 | 9/2018 |
| WO | 2019138810 A1 | 7/2019 |

OTHER PUBLICATIONS

Lam et al., "A Review of Lame and Lamb Mode Crystal Resonators for Timing Applications and Prospects of Lame and Lamb Mode Piezo MEMS Resonators for Filtering Applications," 2018 International Symposium on Acoustic Wave Devices for Future Mobile Communication Systems, Mar. 6-7, 2018, 12 pages.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Acoustic Properties of Solids ONDA Corporation 592 Weddell Drive, Sunnyvale, CA 94089, Apr. 11, 2003, pp. 5 (Year 2003). 2003.

(56) References Cited

OTHER PUBLICATIONS

Bahreyni, B. Fabrication and Design of Resonant Microdevices Andrew William, Inc. 2018, NY (Year 2008). 2008.

Bai et al. "The Simulation of Resonant Mode and Effective Electromechanical Coupling Coefficient of Lithium Niobate Crystal with Different Orientations", J. Phys.: Conf. Ser. 1637 012064, 2020 (Year: 2020).

Buchanan "Ceramic Materials for Electronics" 3rd Edition, first published in 2004 by Marcel Dekker, Inc. pp. 496 (Year 2004). Jan. 2004.

Ekeom, D. & Dubus, Bertrand & Volatier, A . . . (2006). Solidly mounted resonator (SMR) FEM-BEM simulation. 1474-1477. 10.1109/ULTSYM.2006.371.

G. Manohar, "Investigation of Various Surface Acoustic Wave Design Configurations for Improved Sensitivity." Doctoral dissertation, University of South Florida, USA, Jan. 2012, 7 pages.

Gnewuch, et al. "Broadband monolithic acousto-optic tunable filter", Mar. 1, 2000 / vol. 25, No. 5 / Optics Letters (Year: 2000).

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

Kadota et al., "Ultra-Wideband Ladder Filter Using SH0 Plate Wave in Thin LiNbO3 Plate and Its Application to Tunable Filter", IEEE Transactions on Ultrasonics, Ferroelectrics, and Frequency Control, vol. 62, No. 5, May 2015, pp. 939-946 (Year: 2015).

Lin et al., "A novel weighted method for layered SAW filters using slanted finger interdigital transducers", J. Phys. D: Appl. Phys. 39 (2006) pp. 466-470 (Year: 2006).

M. Kadota et al.; "Ultrawide Band Ladder Filter using SH0 plate Wave in Thin LiNb03 Plate and its Application"; 2014 IEEE International Ultrasonics Symposium Proceedings, 2014, pp. 2031-2034. (Year: 2014).

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

M.-H. Li et al.; "Temperature Stability Analysis of Thin-Film Lithium Niobate SH0 Plate Wave Resonators"; Journal of Microelectromechanical Systems, vol. 28, No. 5, Oct. 2019, pp. 799-809. (Year: 2019).

Material Properties of Tibtech Innovations, © 2018 Tibtech Innovations (Year 2018). 2018.

Merriam Webster, dictionary meaning of the word "diaphragm", since 1828, Merriam Webster (Year: 1828) 1828.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Moussa et al. Review on Triggered Liposomal Drug Delivery with a Focus on Ultrasound 2015, Bentham Science Publishers, pp. 16 (Year 2005) 2005.

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Naumenko et al., "Optimal orientations of Lithium Niobate for resonator SAW filters", 2003 IEEE Ultrasonics Symposium—pp. 2110-2113. (Year: 2003).

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

Reinhardt, "Acoustic filters based on thin single crystal $LiNbQ_3$ films: status and prospects", 2014 IEEE International Ultrasonics Symposium Proceedings, pp. 773-781 (Year: 2014).

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

Safari et al. "Piezoelectric for Transducer Applications" published by Elsevier Science Ltd., pp. 4 (Year: 2000). 2020.

Santosh, G. , Surface acoustic wave devices on silicon using patterned and thin film ZnO, Ph.D. thesis, Feb. 2016, Indian Institute of technology Guwahati, Assam, India Feb. 2016.

Sinha et al., "Slanted finger Inter-digital Transducers for the design of improved performance small shape factor mid-bandwidth SAW filters", IEEE MTT-S International Microwave and RF Conference, 2013. (Year: 2013).

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 pp. 675 (Year 2015) Jan. 2015.

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

USPTO/ISA, International Search Report and Written Opinion for PCT Application No. PCT/US2020/45654 dated Oct. 29, 2020.

USPTO/ISA, International Search Report and Written Opinion for PCT Application No. PCT/US2021/024824 dated Jul. 27, 2021, 9 total pages.

USPTO/ISA, International Search Report and Written Opinion for PCT Application No. PCT/US2021/048505 dated Dec. 1, 2021, 11 total pages.

Wu et al., "Frequency band-gap measurement of two-dimensional air/silicon phononic crystals using layered slanted finger interdigital transducers", J. Appl. Phys. 97, 094916, 2005 (Year: 2005).

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Zou, Jie "High-Performance Aluminum Nitride Lamb Wave Resonators for RF Front-End Technology" University of California, Berkeley, Summer 2015, pp. 63 (Year 2015) Jan. 2015.

\* cited by examiner

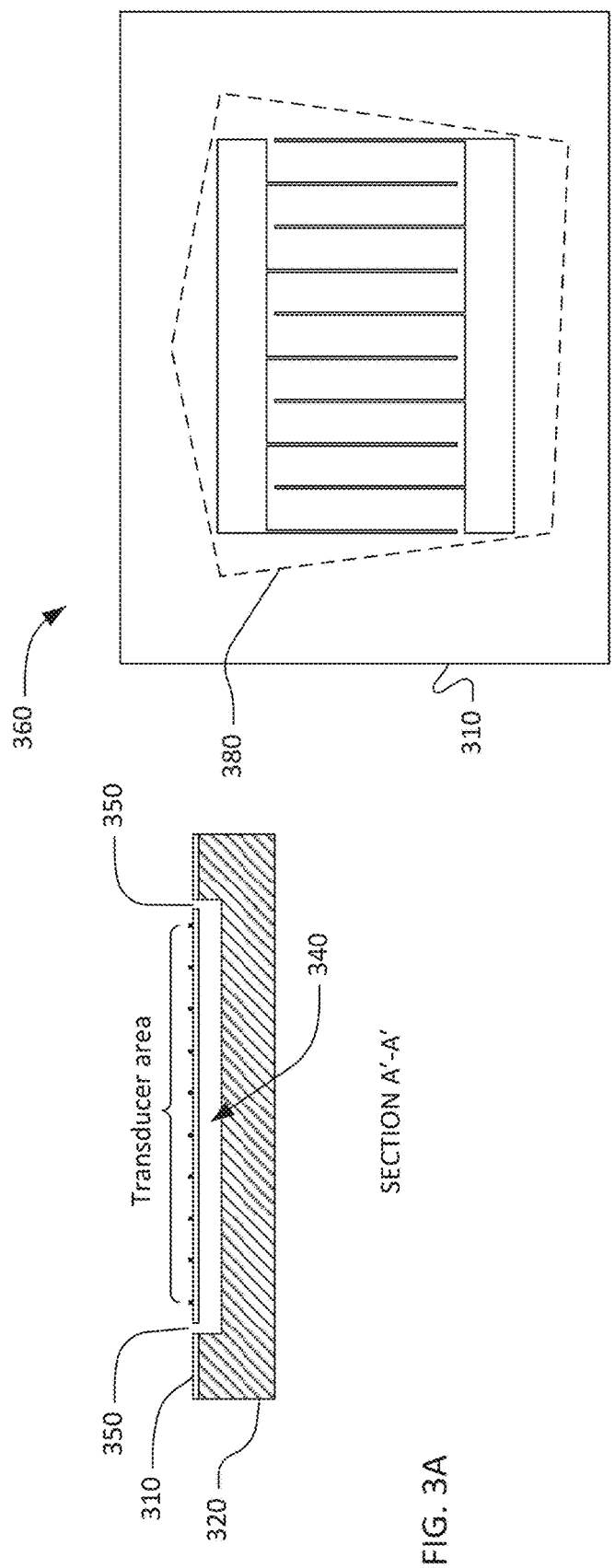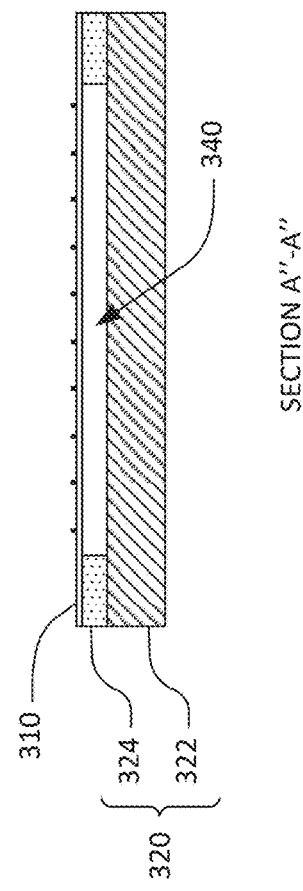

FILTER DEVICE

RELATED APPLICATION INFORMATION

This patent is a continuation-in-part of application Ser. No. 17/131,348 which is a continuation of Ser. No. 16/924,108 and a continuation-in-part of application Ser. No. 17/109,812, both of which are a continuation-in-part of application Ser. No. 16/689,707, now U.S. Pat. No. 10,917,070, which is a continuation of application Ser. No. 16/230,443, now U.S. Pat. No. 10,491,192, which claims priority from the following provisional patent applications: No. 62/685,825; No. 62/701,363; No. 62/741,702; No. 62/748,883; and No. 62/753,815.

This patent is a continuation-in-part of application Ser. No. 17/542,295, which claims priority to Provisional Application No. 63/228,990 and is a continuation-in-part of application Ser. No. 17/351,201, which is a continuation of application Ser. No. 16/988,213, which claims priority to the following provisional applications: No. 62/892,980 and No. 62/904,152. Application Ser. No. 16/988,213 is a continuation-in-part of application Ser. No. 16/438,121, now Pat. No. 10,756,697, which is a continuation-in-part of application Ser. No. 16/230,443, now U.S. Pat. No. 10,491,192, which claims priority from the following provisional applications: No. 62/685,825; No. 62/701,363; No. 62/741,702; No. 62/748,883; and No. 62/753,815.

This patent is a continuation-in-part of application Ser. No. 17/125,960 and application Ser. No. 17/134,213, both of which claims priority to the following provisional applications: No. 63/087,792; and No. 63/072,595.

This patent is a continuation-in-part of application Ser. No. 17/097,238 which is a continuation of application Ser. No. 16/727,304, which claims priority from Provisional Application No. 62/865,798.

This patent is a continuation-in-part of application Ser. No. 17/189,246 which claims priority from Provisional Application No. 62/983,403.

This patent is a continuation-in-part of application Ser. No. 17/109,848 is a continuation of application Ser. No. 17/030,050, which claims priority from Provisional Application No. 62/904,233 and is a continuation-in-part of application Ser. No. 16/920,17, which is a continuation of application Ser. No. 16/438,121.

This patent is a continuation-in-part of application Ser. No. 17/122,977 which claims priority to Provisional Application No. 63/053,584 and Provisional Application No. 63/088,344.

This patent is a continuation-in-part of application Ser. No. 17/133,857 claims priority from Provisional Application No. 63/088,344, and is a continuation-in-part of application Ser. No. 17/070,694, which claims priority to Provisional Application No. 63/040,440.

This patent is a continuation-in-part of application Ser. No. 17/520,689 is a continuation of application Ser. No. 17/189,246, which claims priority from Provisional Application No. 62/983,403.

This patent is a continuation-in-part of application Ser. No. 17/706,154, which is a continuation of application Ser. No. 17/022,048 is a continuation of application Ser. No. 16/924,105, which is a continuation in part of application Ser. No. 16/829,617, which is a continuation of application Ser. No. 16/578,811, now U.S. Pat. No. 10,637,438, which is a continuation-in-part of application Ser. No. 16/230,443, now U.S. Pat. No. 10,491,192.

This patent is a continuation-in-part of application Ser. No. 17/408,264 which claims priority from Provisional Application No. 63/167,510.

This patent is a continuation-in-part of application Ser. No. 17/460,077 and application Ser. No. 17/588,803, both of which claims priority from Provisional Application No. 63/167,506.

All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a passband or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the rejection of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance.

Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies and bandwidths proposed for future communications networks.

The desire for wider communication channel bandwidths will inevitably lead to the use of higher frequency communications bands. Radio access technology for mobile telephone networks has been standardized by the 3GPP ($3^{rd}$ Generation Partnership Project). Radio access technology for $5^{th}$ generation mobile networks is defined in the 5G NR (new radio) standard. The 5G NR standard defines several new communications bands. Two of these new communications bands are N77, which uses the frequency range from 3300 MHz to 4200 MHz, and N79, which uses the frequency range from 4400 MHz to 5000 MHz. Both band N77 and band N79 use time-division duplexing (TDD), such that a communications device operating in band N77 and/or band N79 use the same frequencies for both uplink and downlink transmissions. Bandpass filters for bands N77 and N79 must be capable of handling the transmit power of the communications device. WiFi bands at 5 GHz and 6 GHz also require high frequency and wide bandwidth. The 5G NR standard also defines millimeter wave communication bands with frequencies between 24.25 GHz and 40 GHz.

DESCRIPTION OF THE DRAWINGS

FIG. 3A is an alternative schematic cross-sectional view of the XBAR of FIG. 1.

FIG. 3B is another alternative schematic cross-sectional view of the XBAR of FIG. 1.

FIG. 3C is an alternative schematic plan view of an XBAR.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
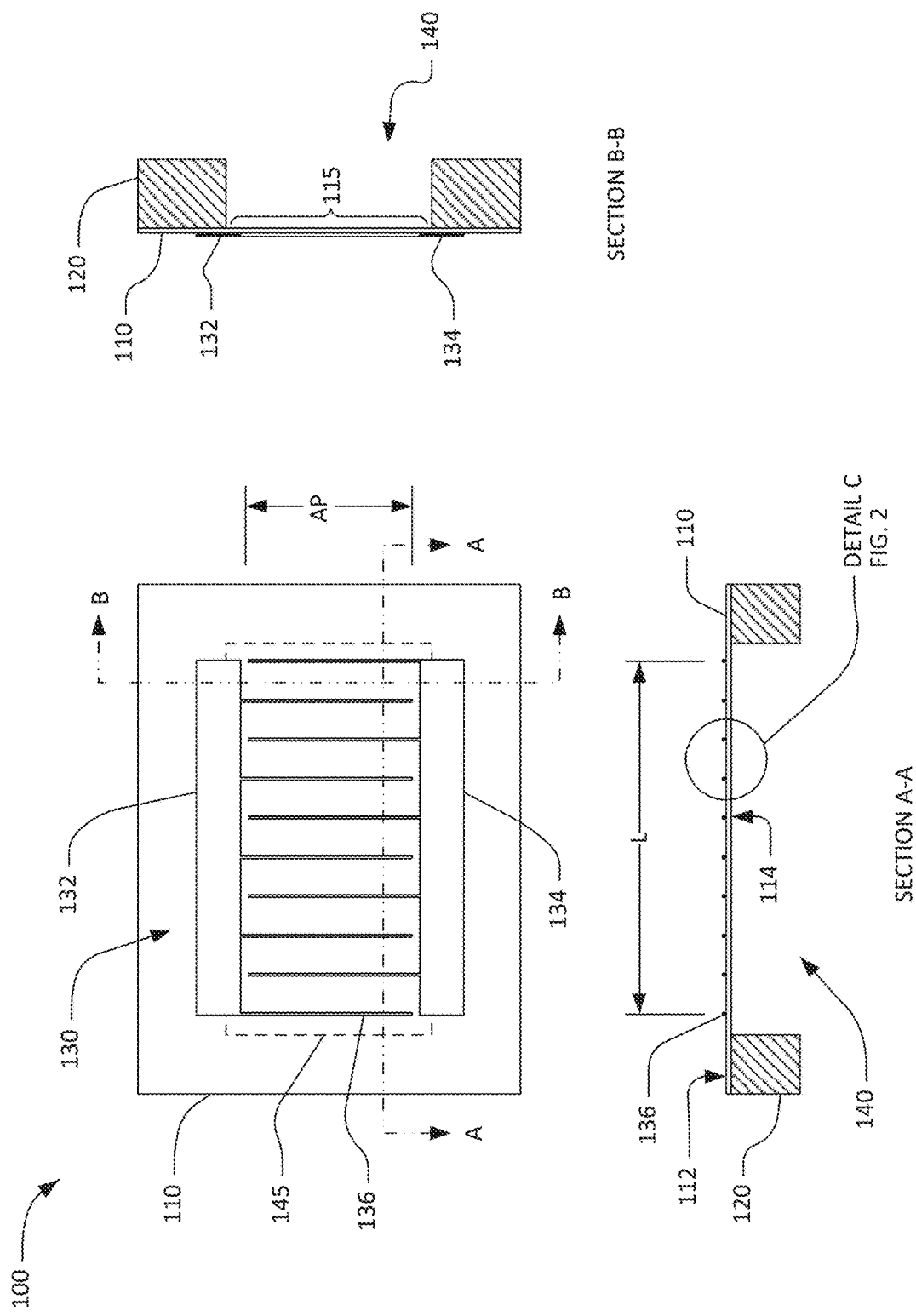
FIG. 1 includes a schematic plan view and two schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having substantially parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations including rotated Z-cut and rotated Y-cut.

A portion of the back surface 114 of the piezoelectric plate 110 is attached to a substrate 120 that provides mechanical support to the piezoelectric plate 110. A cavity 140 is formed in the substrate. "Cavity" has its conventional meaning of "an empty space within a solid body." The cavity 140 may be a hole completely through the substrate 120 (as shown in Section A-A and Section B-B) or a recess in the substrate 120. The cavity 140 may be formed, for example, by selective etching of the substrate 120. The dashed line 145 in the plan view is the perimeter of the cavity 140, which is defined by the intersection of the cavity and the back surface 114 of the piezoelectric plate 110. As shown in FIG. 1, the perimeter 145 of the cavity 140 has a rectangular shape with an extent greater than the aperture AP and length L of the IDT 130. A cavity of an XBAR may have a different shape, such as a regular or irregular polygon. The cavity of an XBAR may more or fewer than four sides, which may be straight or curved.

The portion of the piezoelectric plate 110 outside of the perimeter of the cavity 145 is attached to the substrate. This portion may be referred to as the "supported portion" of the piezoelectric plate. The portion 115 of the piezoelectric plate 110 within the perimeter of the cavity 145 is suspended over the cavity 140 without contacting the substrate 120. The portion 115 of the piezoelectric plate 110 that spans the cavity 140 will be referred to herein as the "diaphragm" 115 due to its similarity to the diaphragm of a microphone.

The substrate 120 may be, for example, silicon, sapphire, quartz, or some other material. The supported portion of the piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layer.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The term "busbar" is commonly used to identify the electrodes that connect the fingers of an IDT. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

The rectangular area defined by the length L and the aperture AP is considered the "transducer area". Substantially all the conversion between electrical and acoustic energy occurs within the transducer area. The electric fields formed by the IDT may extend outside of the transducer area. The acoustic waves excited by the IDT are substantially confined within the transducer area. Small amounts of acoustic energy may propagate outside of the transducer area in both the length and aperture directions. In other embodiments of an XBAR, the transducer area may be shaped as a parallelogram or some other shape rather than rectangular. All the overlapping portions of the IDT fingers and the entire transducer area are positioned on the diaphragm 115, which is to say within the perimeter of the cavity defined by the dashed line 145.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 130. An XBAR may have hundreds, possibly thousands, of parallel fingers in the IDT 130. Similarly, the thickness of the fingers in the cross-sectional views is greatly exaggerated.

Figure 2:
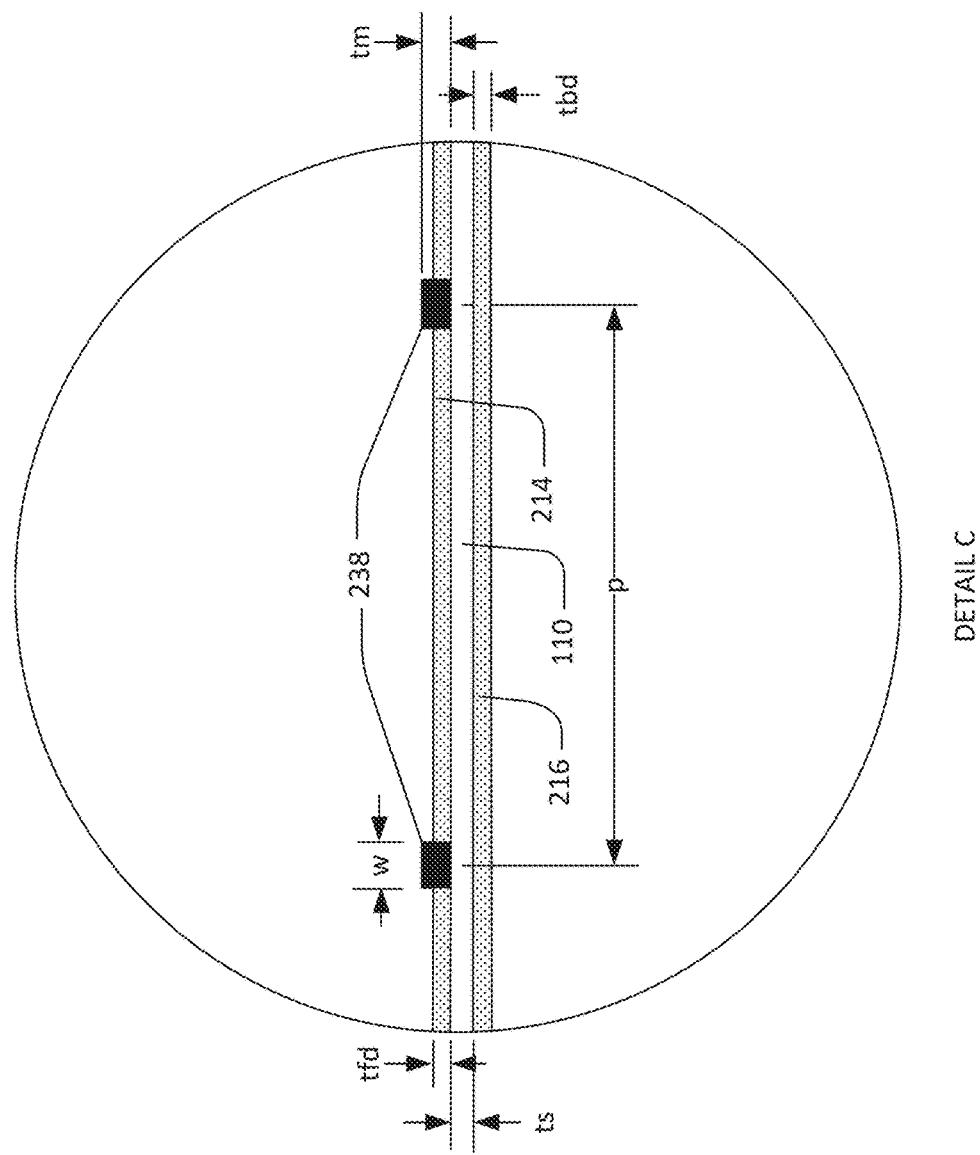
FIG. 2 is an expanded schematic cross-sectional view of a portion of the XBAR of FIG. 1.

FIG. 2 shows a detailed schematic cross-sectional view of the XBAR 100. The piezoelectric plate 110 is a single-crystal layer of piezoelectrical material having a thickness ts. ts may be, for example, 100 nm to 1500 nm. When used in filters for LTE™ bands from 3.4 GHZ to 6 GHz (e.g., bands 42, 43, 46), the thickness ts may be, for example, 200 nm to 1000 nm.

A front-side dielectric layer 214 may optionally be formed on the front side of the piezoelectric plate 110. The "front side" of the XBAR is, by definition, the surface facing away from the substrate. The front-side dielectric layer 214 has a thickness tfd. The front-side dielectric layer 214 is formed between the IDT fingers 238. Although not shown in FIG. 2, the front side dielectric layer 214 may also be deposited over the IDT fingers 238. A back-side dielectric layer 216 may optionally be formed on the back side of the piezoelectric plate 110. The back-side dielectric layer 216 has a thickness tbd. The front-side and back-side dielectric layers 214, 216 may be a non-piezoelectric dielectric material, such as silicon dioxide or silicon nitride. tfd and tbd may be, for example, 0 to 500 nm. tfd and tbd are typically less than the thickness ts of the piezoelectric plate. tfd and tbd are not necessarily equal, and the front-side and back-side dielectric layers 214, 216 are not necessarily the same material. Either or both of the front-side and back-side dielectric layers 214, 216 may be formed of multiple layers of two or more materials.

The IDT fingers 238 may be one or more layers of aluminum or a substantially aluminum alloy, copper or a substantially copper alloy, beryllium, titanium, tungsten, chromium, molybdenum, gold, or some other conductive material. Thin (relative to the total thickness of the conductors) layers of other metals, such as chromium or titanium, may be formed under and/or over the fingers to improve adhesion between the fingers and the piezoelectric plate 110 and/or to passivate or encapsulate the fingers. The busbars (132, 134 in FIG. 1) of the IDT may be made of the same or different materials as the fingers.

Dimension p is the center-to-center spacing or "pitch" of the IDT fingers, which may be referred to as the pitch of the IDT and/or the pitch of the XBAR. Dimension w is the width or "mark" of the IDT fingers. The IDT of an XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e., the mark or finger width is about one-fourth of the acoustic wavelength at resonance). In an XBAR, the pitch p of the IDT is typically 2.5 to 10 times the width w of the fingers. In addition, the pitch p of the IDT is typically 2.5 to 25 times the thickness is of the piezoelectric slab 212. The width of the IDT fingers in an XBAR is not constrained to one-fourth of the acoustic wavelength at resonance. For example, the width of XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

FIG. 3A and FIG. 3B show two alternative cross-sectional views along the section plane A-A defined in FIG. 1. In FIG. 3A, a piezoelectric plate 310 is attached to a substrate 320. A cavity 340, which does not fully penetrate the substrate 320, is formed in the substrate under the portion of the piezoelectric plate 310 containing the IDT of an XBAR. The cavity 340 may be formed, for example, by etching the substrate 320 before attaching the piezoelectric plate 310. Alternatively, the cavity 340 may be formed by etching the substrate 320 with a selective etchant that reaches the substrate through one or more openings 350 provided in the piezoelectric plate 310.

In FIG. 3B, the substrate 320 includes a base 322 and an intermediate layer 324 disposed between the piezoelectric plate 310 and the base 322. For example, the base 322 may be silicon and the intermediate layer 324 may be silicon dioxide or silicon nitride or some other material. A cavity 340 is formed in the intermediate layer 324 under the portion of the piezoelectric plate 310 containing the IDT of an XBAR. The cavity 340 may be formed, for example, by etching the intermediate layer 324 before attaching the piezoelectric plate 310. Alternatively, the cavity 340 may be formed by etching the intermediate layer 324 with a selective etchant that reaches the substrate through one or more openings provided in the piezoelectric plate 310.

FIG. 3C is a schematic plan view of another XBAR 360. The XBAR 360 includes an IDT formed on a piezoelectric plate 310. The piezoelectric plate 310 is disposed over a cavity 380 in a substrate. In this example, the cavity 380 has an irregular polygon shape such that none of the edges of the cavity are parallel, nor are they parallel to the conductors of the IDT. A cavity may have a different shape with straight or curved edges.

Figure 4:
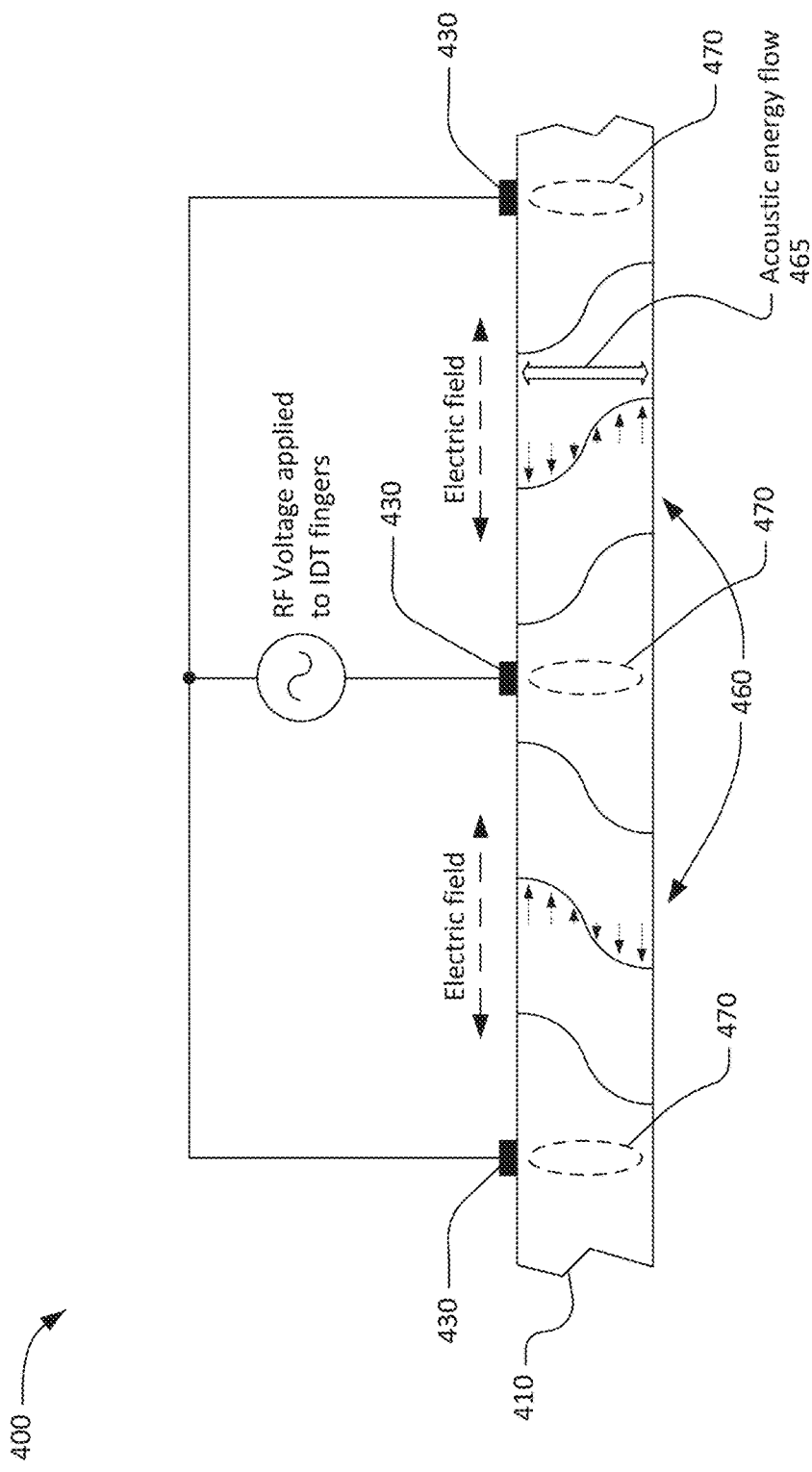
FIG. 4 is a graphic illustrating a shear horizontal acoustic mode in an XBAR.

FIG. 4 is a graphical illustration of the primary acoustic mode of interest in an XBAR. FIG. 4 shows a small portion of an XBAR 400 including a piezoelectric plate 410 and three interleaved IDT fingers 430. An RF voltage is applied to the interleaved fingers 430. This voltage creates a time-varying electric field between the fingers. The direction of the electric field is lateral, or parallel to the surface of the piezoelectric plate 410, as indicated by the arrows labeled "electric field". Due to the high dielectric constant of the piezoelectric plate, the electric field is highly concentrated in the plate relative to the air. The lateral electric field introduces shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the XBAR 400 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e., horizontal as shown in FIG. 4), the direction of acoustic energy flow of the excited shear acoustic waves is substantially vertical, normal to the surface of the piezoelectric plate, as indicated by the arrow 465.

Considering FIG. 4, there is essentially no electric field immediately under the IDT fingers 430, and thus acoustic modes are only minimally excited in the regions 470 under the fingers. There may be evanescent acoustic motions in these regions. Since acoustic vibrations are not excited under the IDT fingers 430, the acoustic energy coupled to the IDT fingers 430 is low (for example compared to the fingers of an IDT in a SAW resonator), which minimizes viscous losses in the IDT fingers.

An acoustic resonator based on shear acoustic wave resonances can achieve better performance than current state-of-the art film-bulk-acoustic-resonators (FBAR) and solidly-mounted-resonator bulk-acoustic-wave (SMR BAW) devices where the electric field is applied in the thickness direction. In such devices, the acoustic mode is compressive with atomic motions and the direction of acoustic energy flow in the thickness direction. In addition, the piezoelectric coupling for shear wave XBAR resonances can be high (>20%) compared to other acoustic resonators. Thus, high piezoelectric coupling enables the design and implementation of microwave and millimeter-wave filters with appreciable bandwidth.

Figure 5:
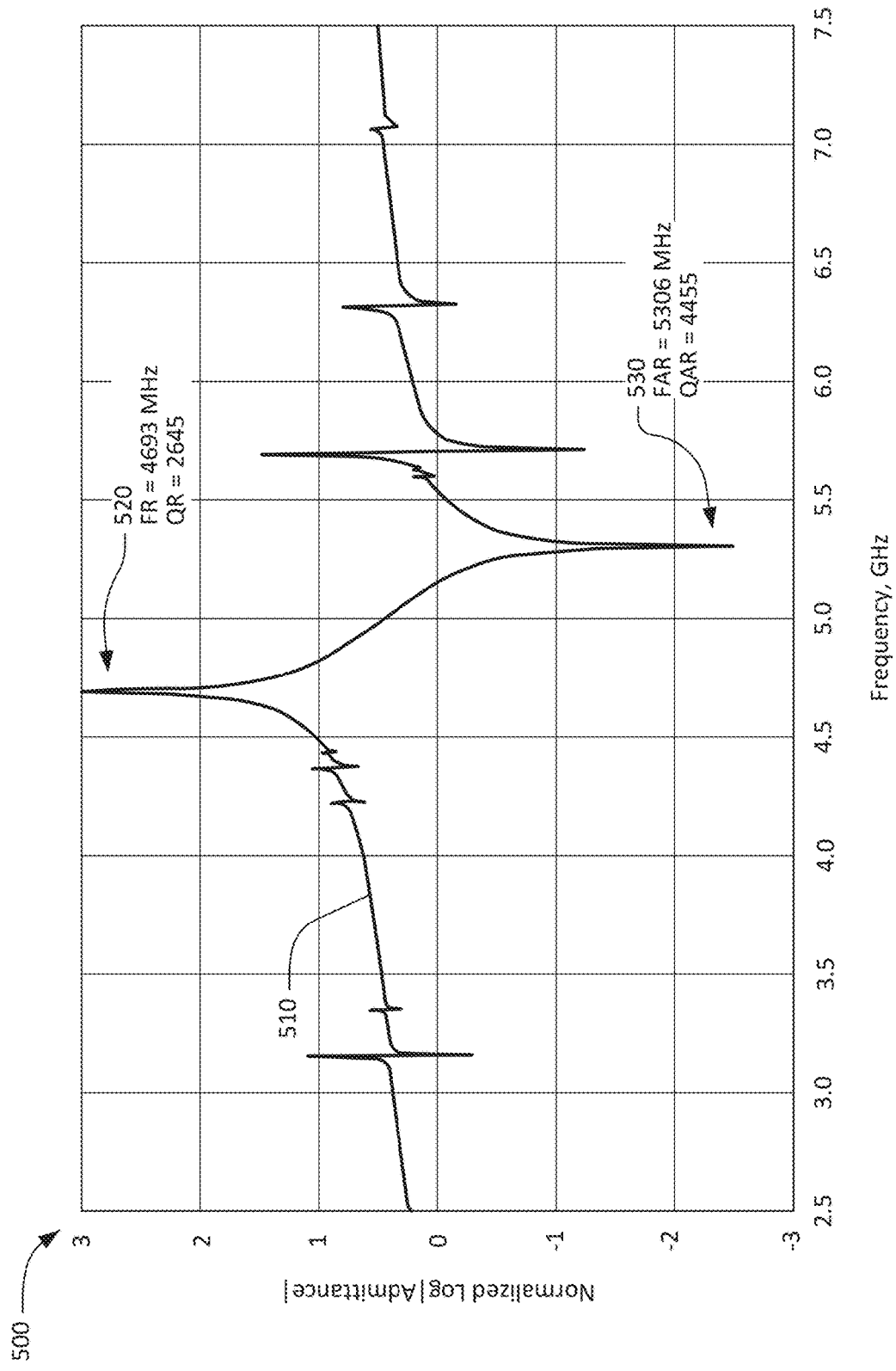
FIG. 5 is a chart of the admittance of a simulated XBAR.

FIG. 5 is a chart 500 with a plot 510 of the normalized magnitude of the admittance (on a logarithmic scale) as a function of frequency of an XBAR simulated using finite element method (FEM) simulation techniques. In the simulated XBAR, the piezoelectric plate is Z-cut (i.e., Z axis normal to the plate) lithium niobate. The IDT fingers are aluminum. The IDT is oriented such that the y-axis of the piezoelectric plate is normal to the IDT fingers. The substrate supporting the piezoelectric plate is silicon with a cavity formed completely through the silicon (as shown in FIG. 1). Losses in the piezoelectric plate and IDT fingers were simulated using standard material parameters. The simulated physical dimensions are as follows: is =400 nm; tfd=0; tbd=0; tm=100 nm; p=5 µm; w=500 nm. The admittance is normalized for a single pair of IDT fingers and an aperture of 1 meter. The admittance of an XBAR with N IDT fingers and an aperture A (in m) can be estimated by multiplying the normalized admittance provided in FIG. 5 by (N−1)·A.

The simulated XBAR exhibits a resonance at a frequency FR 520 of 4693 MHz and an anti-resonance at a frequency FAR 530 of 5306 MHz. The Q at resonance QR is 2645 and the Q at anti-resonance QAR is 4455. The absolute difference between FAR and FR is about 600 MHz, and the fractional difference is about 0.12. The acoustic coupling can be roughly estimated to 24%. Secondary resonances are evident in the admittance curve at frequencies below FR and above FAR.

Acoustic RF filters usually incorporate multiple acoustic resonators. Typically, these resonators have at least two different resonance frequencies. For example, an RF filter using the well-known "ladder" filter architecture includes shunt resonators and series resonators. A shunt resonator typically has a resonance frequency below the passband of the filter and an anti-resonance frequency within the passband. A series resonator typically has a resonance frequency within the pass band and an anti-resonance frequency above the passband. In many filters, each resonator has a unique resonance frequency. An ability to obtain different resonance frequencies for XBARs made on the same piezoelectric plate greatly simplifies the design and fabrication of RF filters using XBARs.

Figure 6:
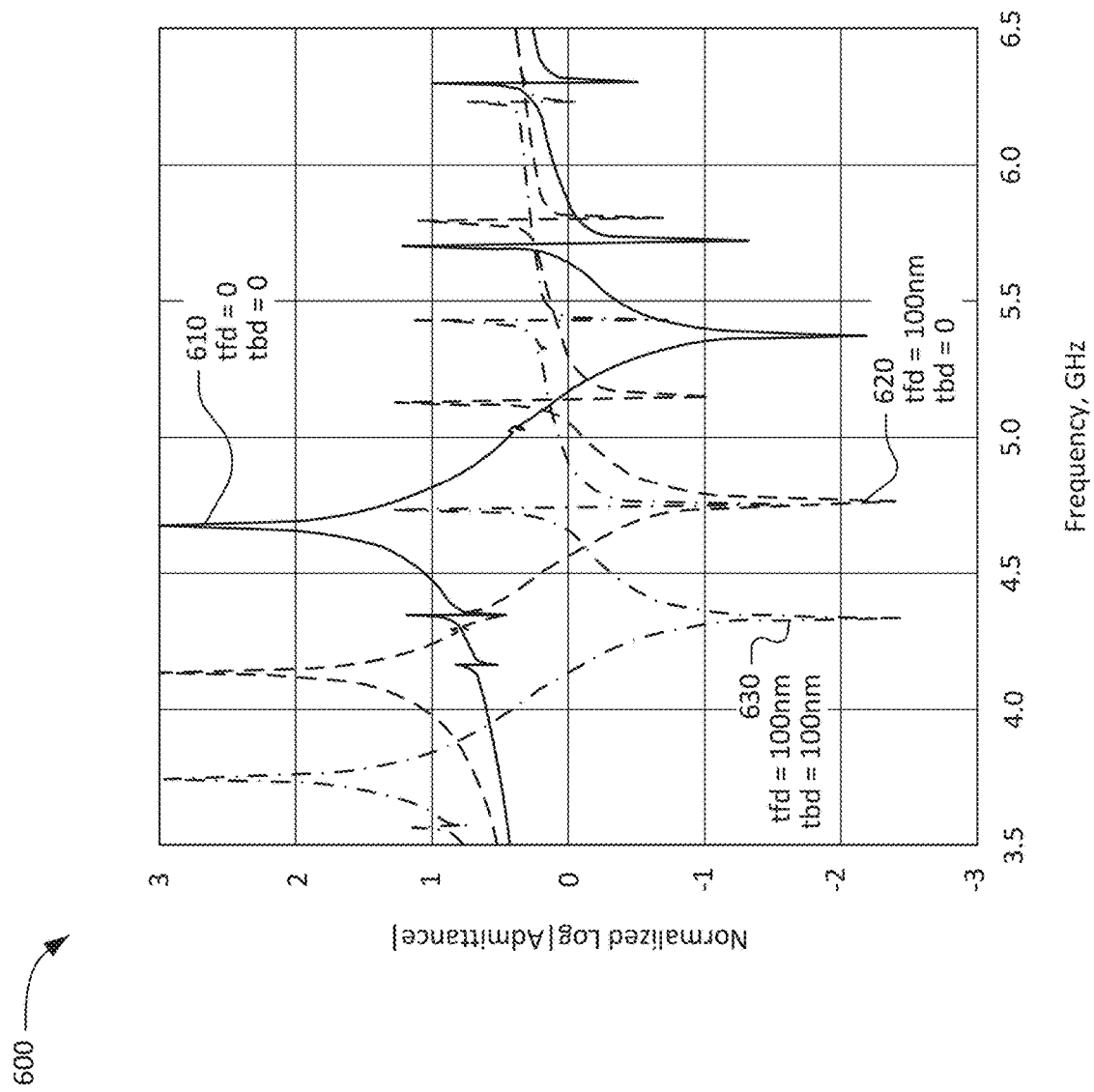
FIG. 6 is a chart comparing the admittances of three simulated XBARs with different dielectric layers.

FIG. 6 is a graph 600 comparing the normalized admittances, as functions of frequency, of three XBARs with different dielectric layers. The admittance data, which is presented on a log scale, results from two-dimensional simulation of a XBAR structure using the same materials and dimensions (except for the dielectric layers) as the previous example. The admittance is normalized for a single pair of IDT fingers and an aperture of 1 m. The solid line 610 is a plot of the normalized admittance per unit aperture for an XBAR with tfd=tbd=0 (i.e., an XBAR without dielectric layers). The normalized admittance of this XBAR is comparable to the normalized admittance plot in FIG. 5, with slight differences due to the different simulation methodologies. The dashed line 620 is a plot of the normalized admittance for an XBAR with 100 nm of SiO2 on the front surface of the piezoelectric slab between the IDT fingers (tfd=100 nm and tbd=0). The addition of the $SiO_2$ layer on the front surface of the piezoelectric plate shifts the resonance frequency down by about 500 MHz, or about 11%, compared to the XBAR with no dielectric layers. The dash-dot line 630 is a plot of the normalized admittance for an XBAR with 100 nm of $SiO_2$ over the front surface of the piezoelectric slab between the IDT fingers and 100 nm of $SiO_2$ on the back surface of the piezoelectric slab (tfd=tbd=100 nm). The addition of the $SiO_2$ layers on both surfaces of the piezoelectric plate shifts the resonance frequency down by about 900 MHz, or 20%, compared to the XBAR with no dielectric layers.

Figure 7:
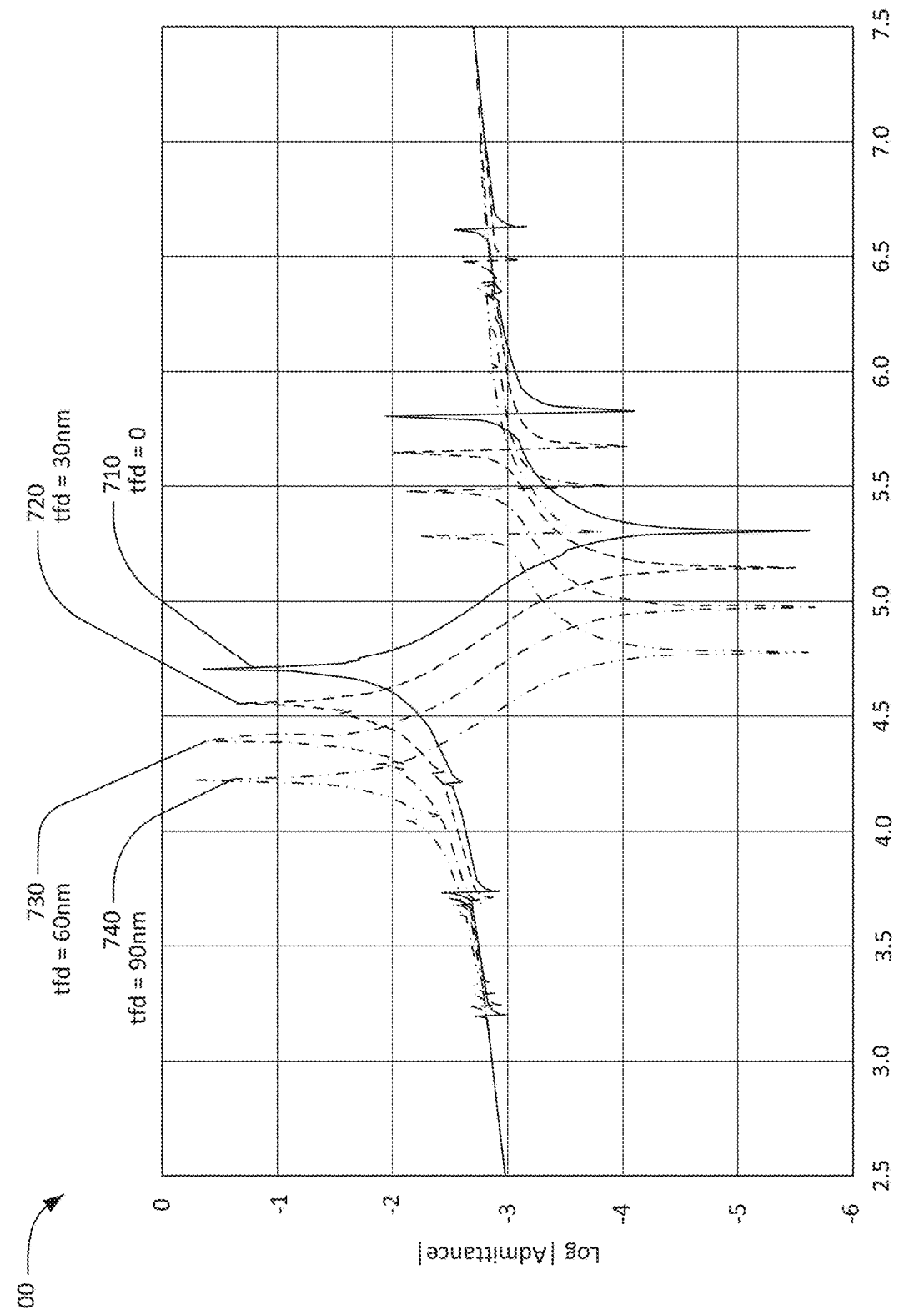
FIG. 7 is a chart comparing the admittances of four simulated XBARs with different dielectric layer thicknesses.

FIG. 7 is a graph 700 comparing the admittances, as functions of frequency, of four XBARs with different front-side dielectric layer thicknesses. The admittance data results from three-dimensional simulation of XBARs with the following parameter: is =400 nm; tfd=0, 30, 60, 90 nm; tbd=0; tm=100 nm; p=4.2 μm; w=500 nm; AP=20 μm; and N (total number of IDT fingers)=51. The substrate is Z-cut lithium niobate, the IDT conductors are aluminum, and the dielectric layers are SiO2.

The solid line 710 is a plot of the admittance of an XBAR with tfd=0 (i.e., an XBAR without dielectric layers). The dashed line 720 is a plot of the admittance of an XBAR with tfd=30 nm. The addition of the 30 nm dielectric layer reduces the resonant frequency by about 145 MHz compared to the XBAR without dielectric layers. The dash-dot line 730 is a plot of the admittance of an XBAR with tfd=60 nm. The addition of the 60 nm dielectric layer reduces the resonant frequency by about 305 MHz compared to the XBAR without dielectric layers. The dash-dot-dot line 740 is a plot of the admittance of an XBAR with tfd=90 nm. The addition of the 90 nm dielectric layer reduces the resonant frequency by about 475 MHz compared to the XBAR without dielectric layers. The frequency and magnitude of the secondary resonances are affected differently than the primary shear-mode resonance.

Importantly, the presence of the dielectric layers of various thicknesses has little or no effect on the piezoelectric coupling, as evidenced by the nearly constant frequency offset between the resonance and anti-resonance of each XBAR.

Figure 8:
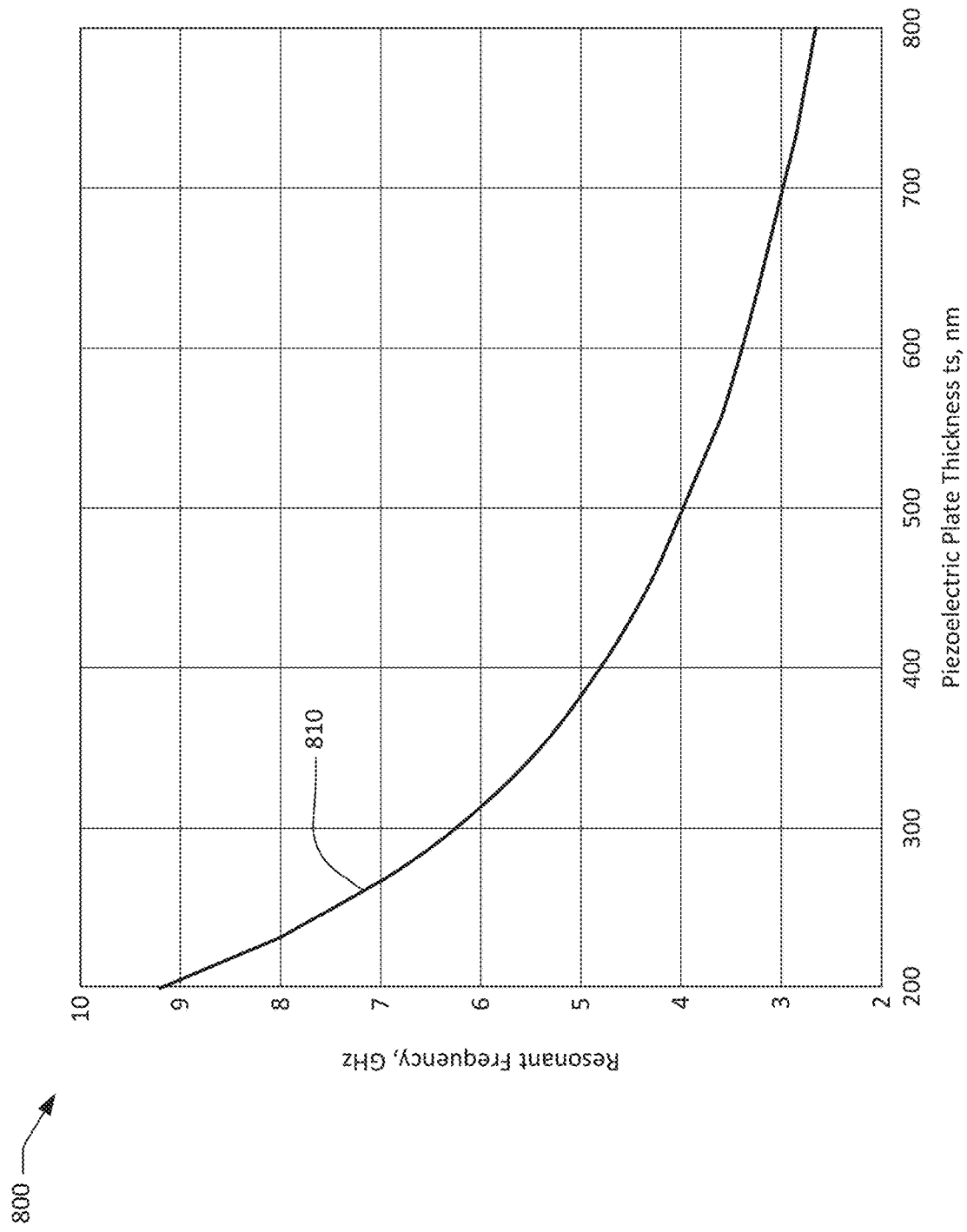
FIG. 8 is a plot showing the effect of piezoelectric plate thickness on resonance frequency of an XBAR.
Figure 9:
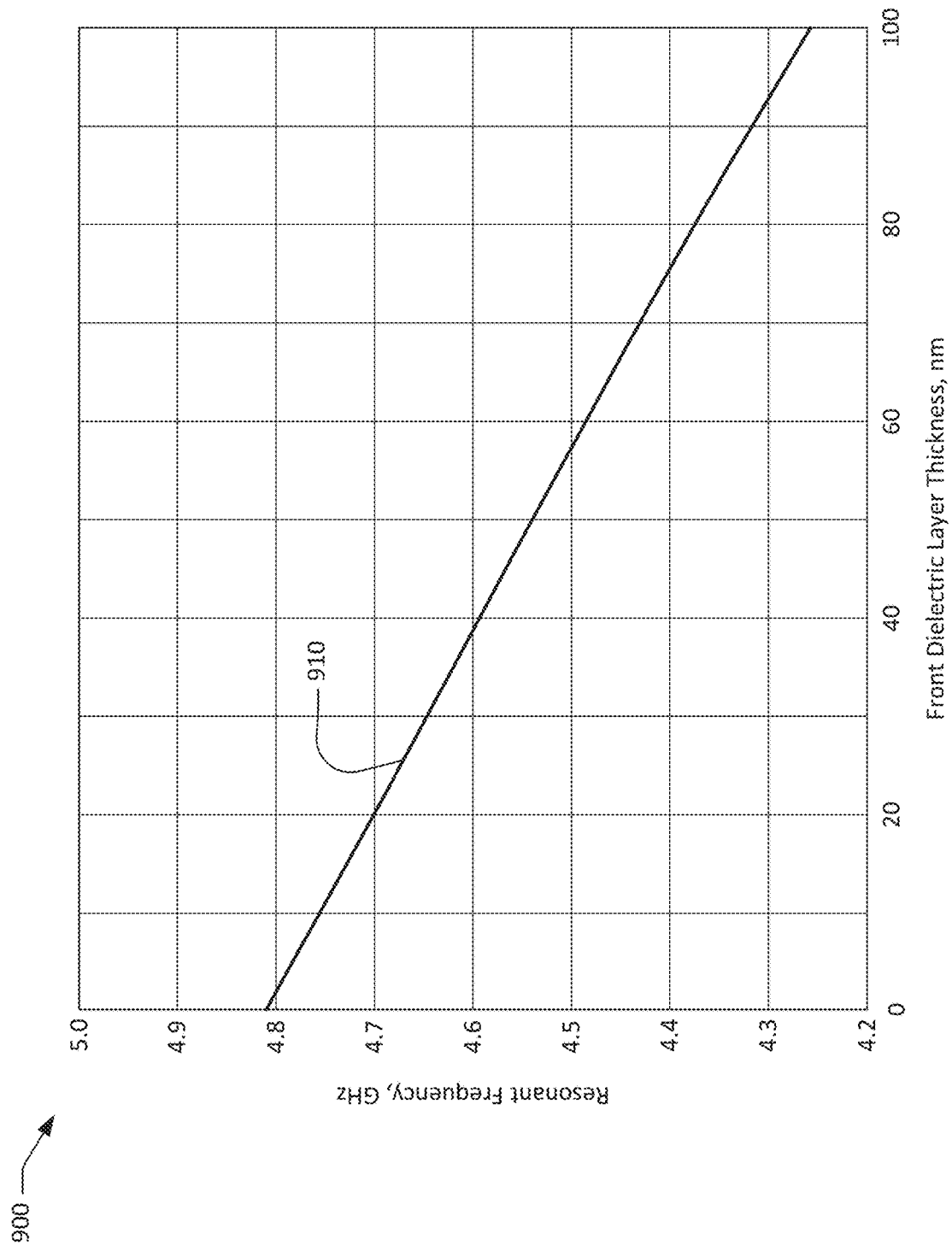
FIG. 9 is a plot showing the effect of front dielectric layer thickness on resonance frequency of an XBAR.
Figure 10:
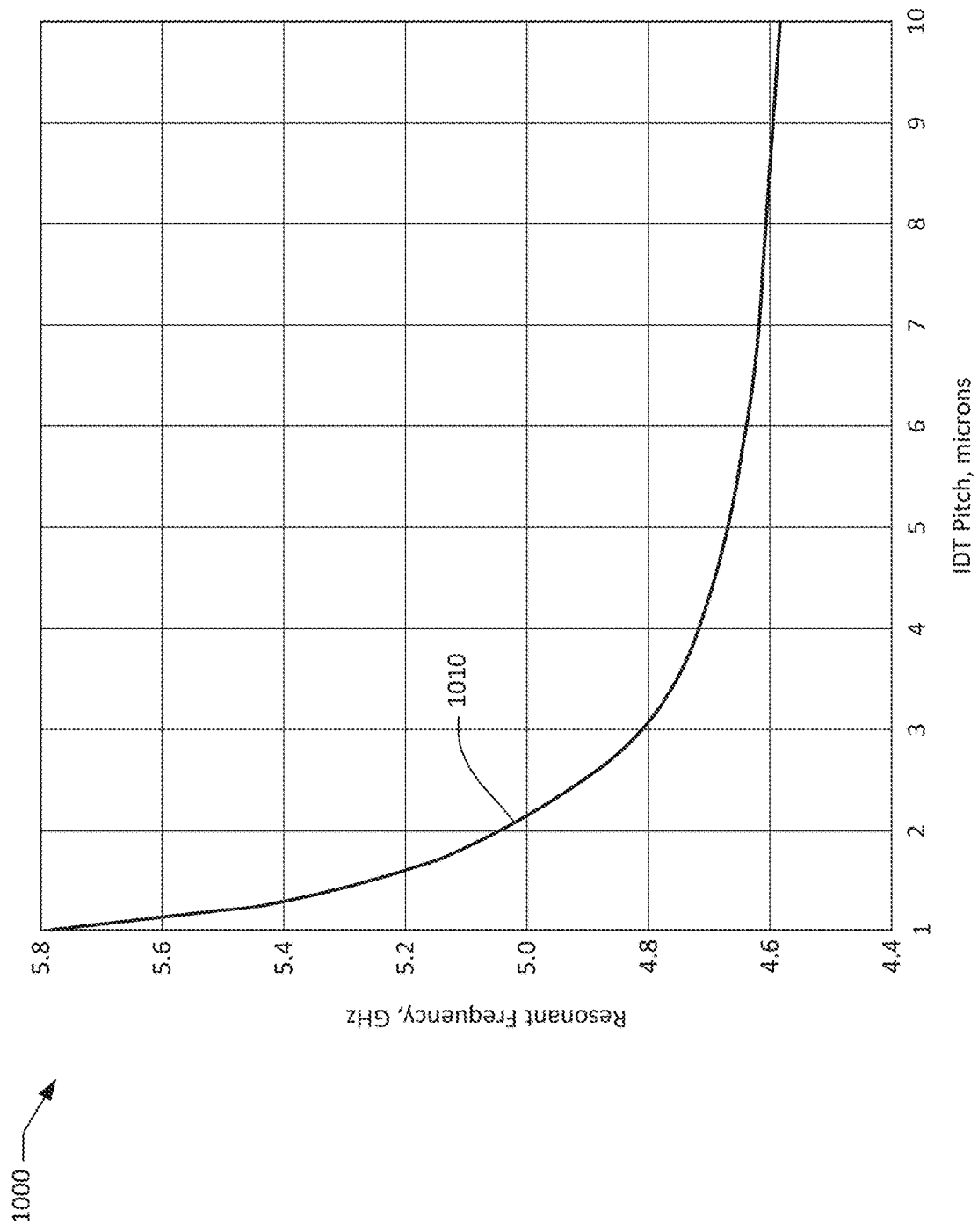
FIG. 10 is a plot showing the effect of IDT finger pitch on resonance frequency of an XBAR.

FIG. 8, FIG. 9, and FIG. 10 are graphs showing the dependence, determined by simulation, of resonant frequency on XBAR physical characteristics. Specifically, FIG. 8 is a graph 800 with curve 810 showing resonant frequency as a function of piezoelectric plate thickness ts with IDT finger pitch p=3 microns and no front-side or back-side dielectric layer (tfd=tbd=0). FIG. 9 is a graph 900 with curve 910 showing resonant frequency as a function of front-side dielectric layer thickness tfd for piezoelectric plate thickness ts=400 nm and IDT finger pitch p=3 microns. FIG. 10 is a graph 1000 with curve 1010 showing resonant frequency as a function of IDT finger pitch p with piezoelectric plate thickness ts=400 nm and tfd=tbd=0. In all cases, the piezoelectric substrate is Z-cut lithium niobate and the IDT fingers were aluminum with a width w=500 nm and thickness tm=100 nm. The front-side dielectric layer, when present, is SiO2. The range of pitch p from 1.0 to 10.0 microns is equivalent to 2.5 to 25 times the piezoelectric plate thickness and 2 to 20 time the IDT finger width.

Figure 11:
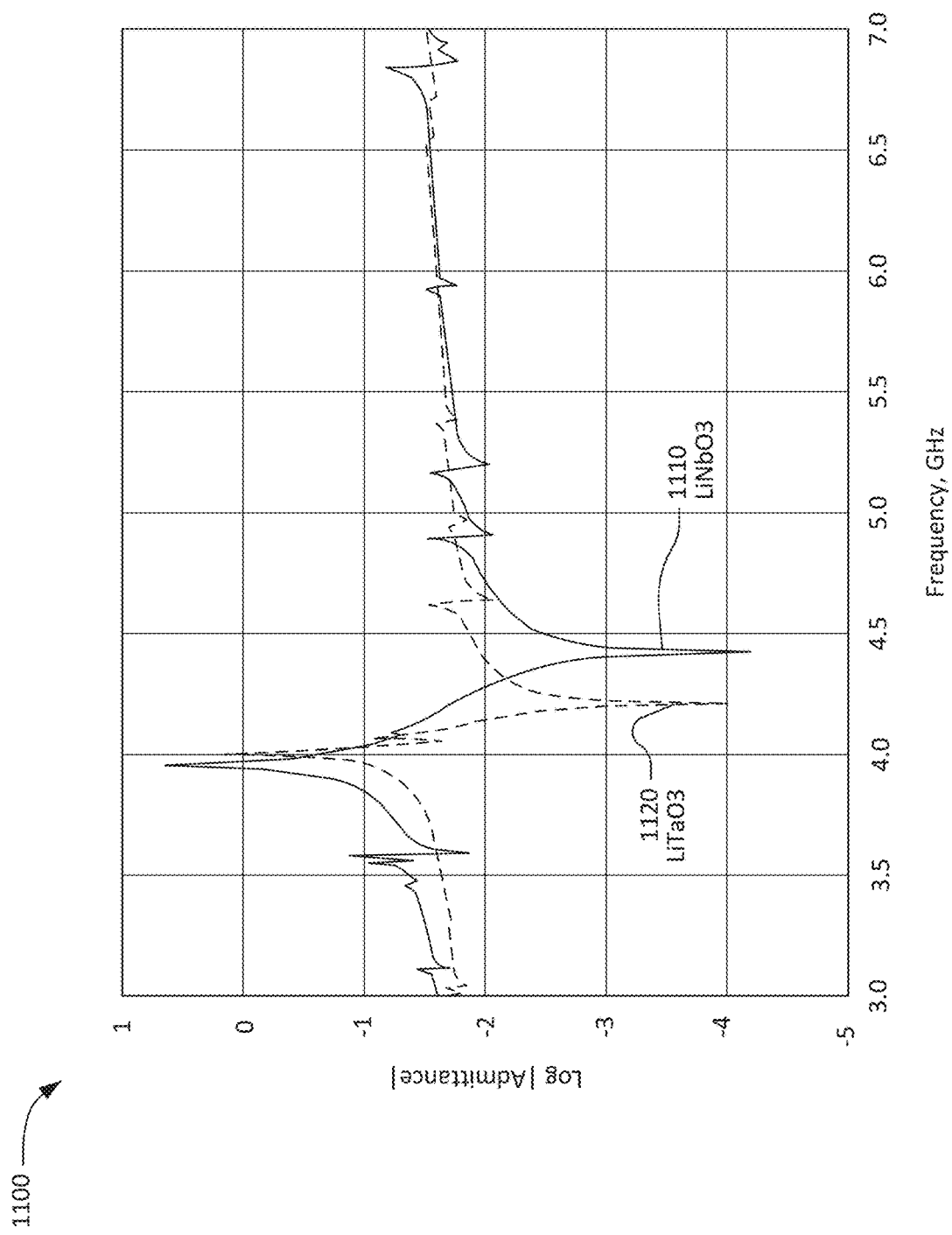
FIG. 11 is a chart comparing the admittances of XBARs on LiNbO3 and LiTaO3 plates.

FIG. 11 is a graph 1100 comparing the admittances, as functions of frequency, of two XBARs with different piezoelectric plate materials. The admittance data results from three-dimensional simulation of XBARs with the following parameter: ts=415 nm; tfd=120 nm; tbd=0; tm=460 nm; p=4.5 μm; w=700 nm; AP=71 μm; and N (total number of IDT fingers)=221. The substrate is Z-cut lithium niobite or Z-cut lithium tantalate, the IDT electrodes are copper, and the dielectric layer is SiO2.

The solid line 1110 is a plot of the admittance of an XBAR on a lithium niobate plate. The dashed line 1120 is a plot of the admittance of an XBAR on a lithium tantalate plate. Notably, the difference between the resonance and anti-resonance frequencies of the lithium tantalate XBAR is about 5%, or half of the frequency difference of the lithium niobate XBAR. The lower frequency difference of the lithium tantalate XBAR is due to the weaker piezoelectric coupling of the material. The measured temperature coefficient of the resonance frequency of a lithium niobate XBAR is about −71 parts-per-million per degree Celsius. The temperature coefficient of frequency (THF) for lithium tantalate XBARs will be about half that of lithium niobate XBARs. Lithium tantalate XBARs may be used in applications that do not require the large filter bandwidth possible with lithium niobate XBARs and where the reduced TCF is advantageous.

Figure 12:
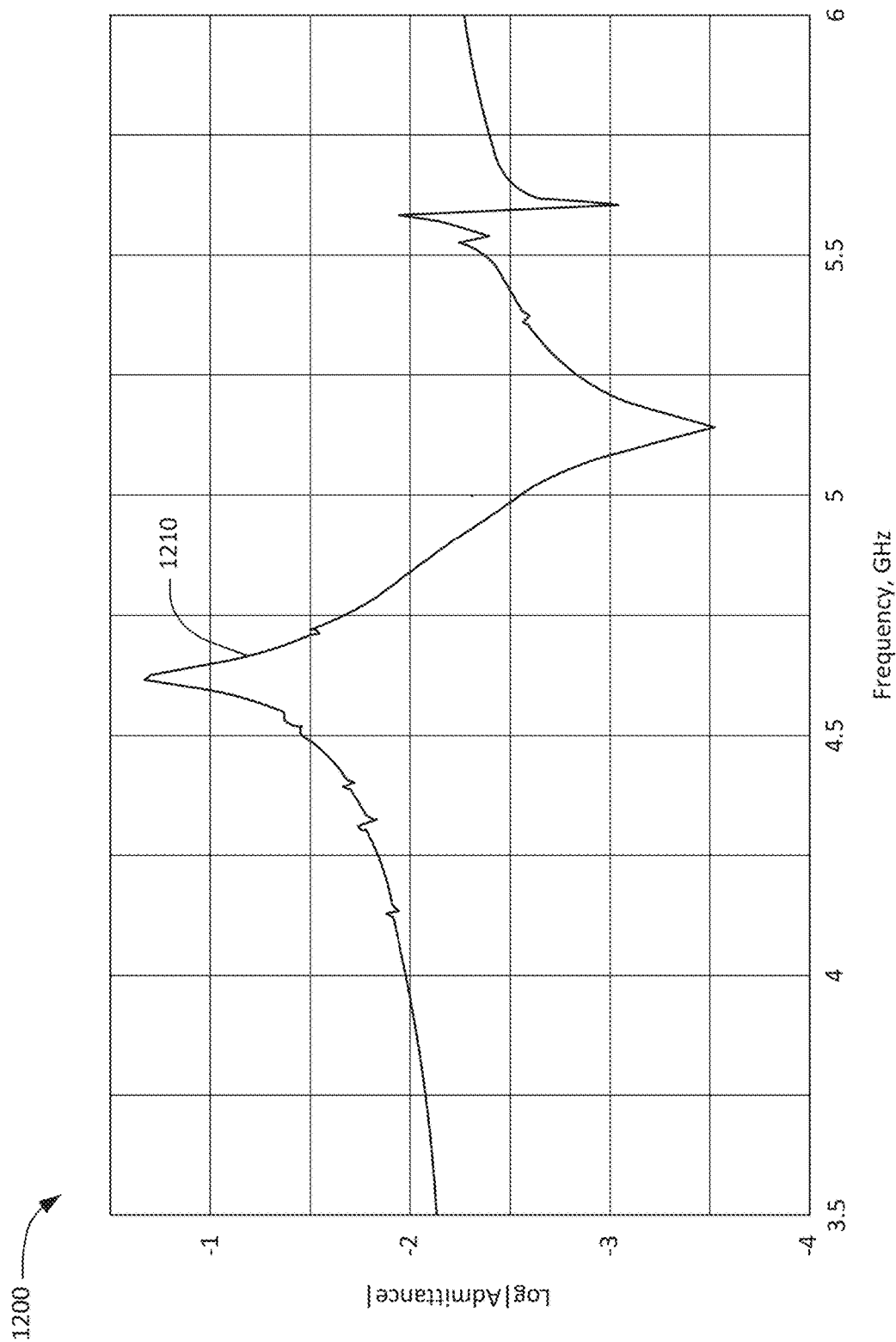
FIG. 12 is a chart of the measured admittance of an XBAR.

FIG. 12 is a chart 1200 showing the measured admittance of an experimental XBAR fabricated on a Z-cut lithium niobate plate with a thickness of 400 nm. The IDT had a pitch of 5 μm, an aperture of 40 μm, and 101 IDT fingers. The IDT fingers were aluminum with a thickness of 100 nm. The device did not include dielectric layers. The solid line 1210 is the magnitude of admittance as a function of frequency. The resonance frequency is 4617 MHz and the anti-resonance frequency is 5138 MHz. The frequency difference is 521 MHz or more than 11% of the resonance frequency. The measured data has not been corrected for the effects of the measurement system. Typically, correcting for the measurement system increases the anti-resonance frequency and the different between the anti-resonance and resonance frequencies.

Figure 13:
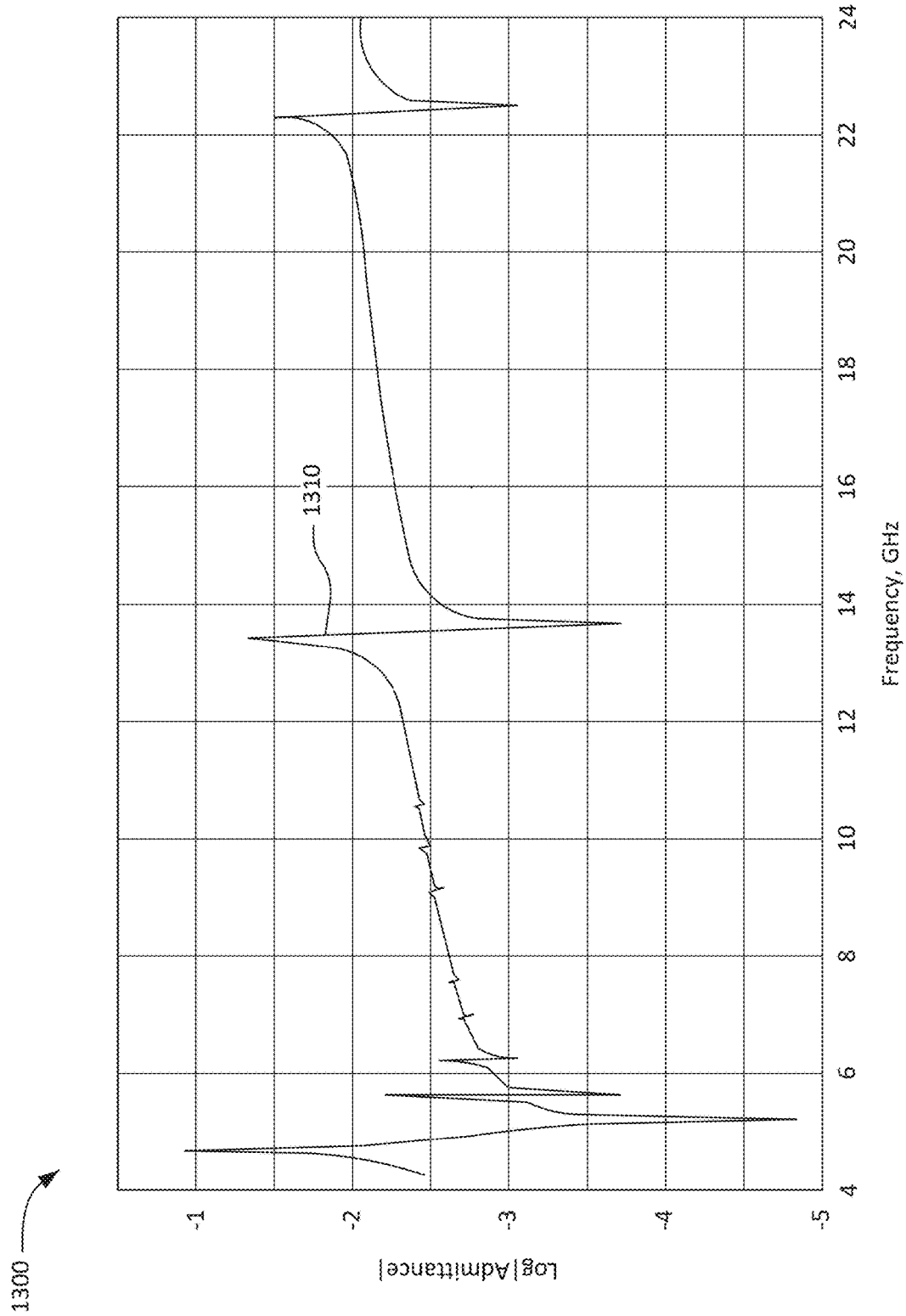
FIG. 13 is another chart of the measured admittance of an XBAR.

FIG. 13 is a chart 1300 showing the measured admittance of another experimental XBAR fabricated on a Z-cut lithium niobate plate with a thickness of 400 nm. The IDT had a pitch of 5 μm, an aperture of 20 μm, and 51 fingers. The IDT fingers were aluminum with a thickness of 100 nm. The device did not include dielectric layers. The solid line 1310 is the magnitude of admittance as a function of frequency. The third and fifth harmonics of the primary XBAR resonance are visible at about 13.5 GHz and 22.5 GHz, respectively. Resonances have been measured in other XBARs at frequencies as high as 60 GHz.

Figure 14:
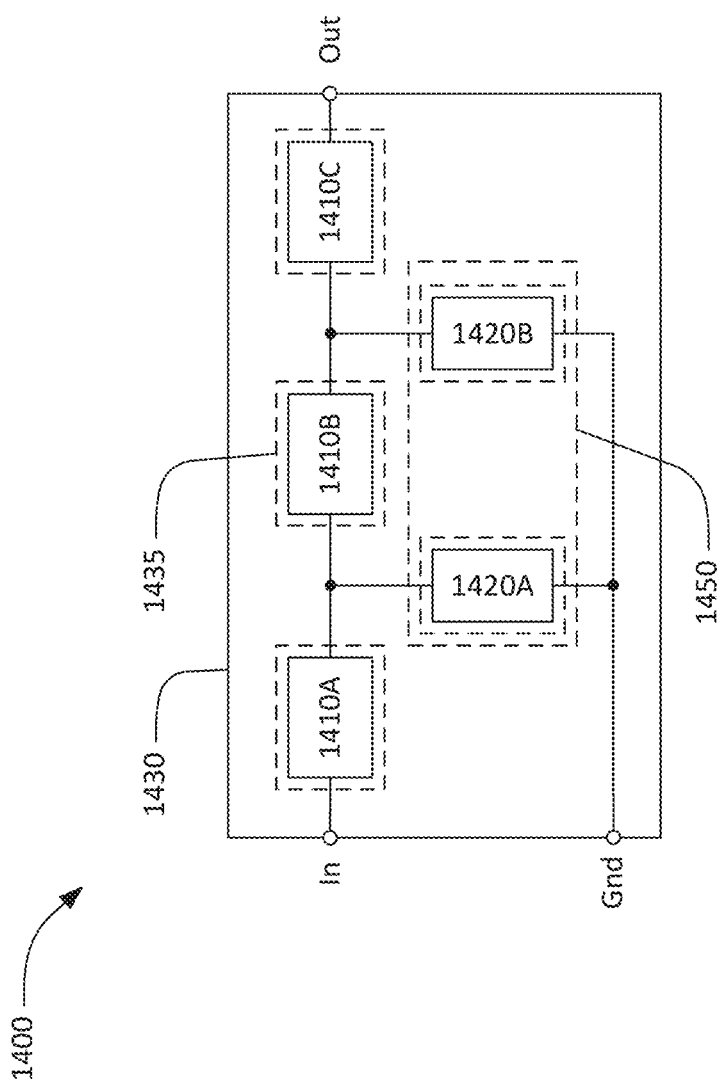
FIG. 14 is a schematic circuit diagram and layout of a filter using XBARs.

FIG. 14 is a schematic circuit diagram for a high frequency band-pass filter 1400 using XBARs. The filter 1400 has a conventional ladder filter architecture including three series resonators 1410A, 1410B, 1410C and two shunt resonators 1420A, 1420B. The three series resonators 1410A, 1410B, and 1410C are connected in series between a first port and a second port. In FIG. 14, the first and second ports are labeled "In" and "Out", respectively. However, the filter 1400 is bidirectional and either port and serve as the input or output of the filter. The two shunt resonators 1420A, 1420B are connected from nodes between the series resonators to ground. All the shunt resonators and series resonators are XBARs.

The three series resonators 1410A, B, C and the two shunt resonators 1420A, B of the filter 1400 are formed on a single plate 1430 of piezoelectric material bonded to a silicon substrate (not visible). Each resonator includes a respective IDT (not shown), with at least the transducer area of the IDT disposed over a cavity in the substrate. In this and similar contexts, the term "respective" means "relating things each to each", which is to say with a one-to-one correspondence. In FIG. 14, the cavities are illustrated schematically as the dashed rectangles (such as the rectangle 1435). In this example, each IDT is disposed over a respective cavity. In other filters, the IDTs of two or more resonators may be disposed over a single cavity.

In a ladder band-pass filter circuit, the anti-resonance frequencies of the series resonators 1410A, 1410B, 1410C are typically above the upper edge of the filter passband. Since each series resonator has very low admittance, approaching an open circuit, at its anti-resonance frequency, the series resonators create transmission minimums (common called "transmission zeros") above the passband. The resonance frequencies of the shunt resonators are typically below the lower band edge of the filter pass band. Since each shunt resonator has very high admittance, approaching a short circuit, at its resonance frequency, the shunt resonators create transmission minimums (common called "transmission zeros") below the passband.

In some broadband filters, a dielectric layer may be formed on the top side, the bottom side, or both sides of the diaphragms of the shunt resonators to lower the resonance frequencies of the shunt resonators relative to the anti-resonance frequencies of the series resonators.

Figure 20:
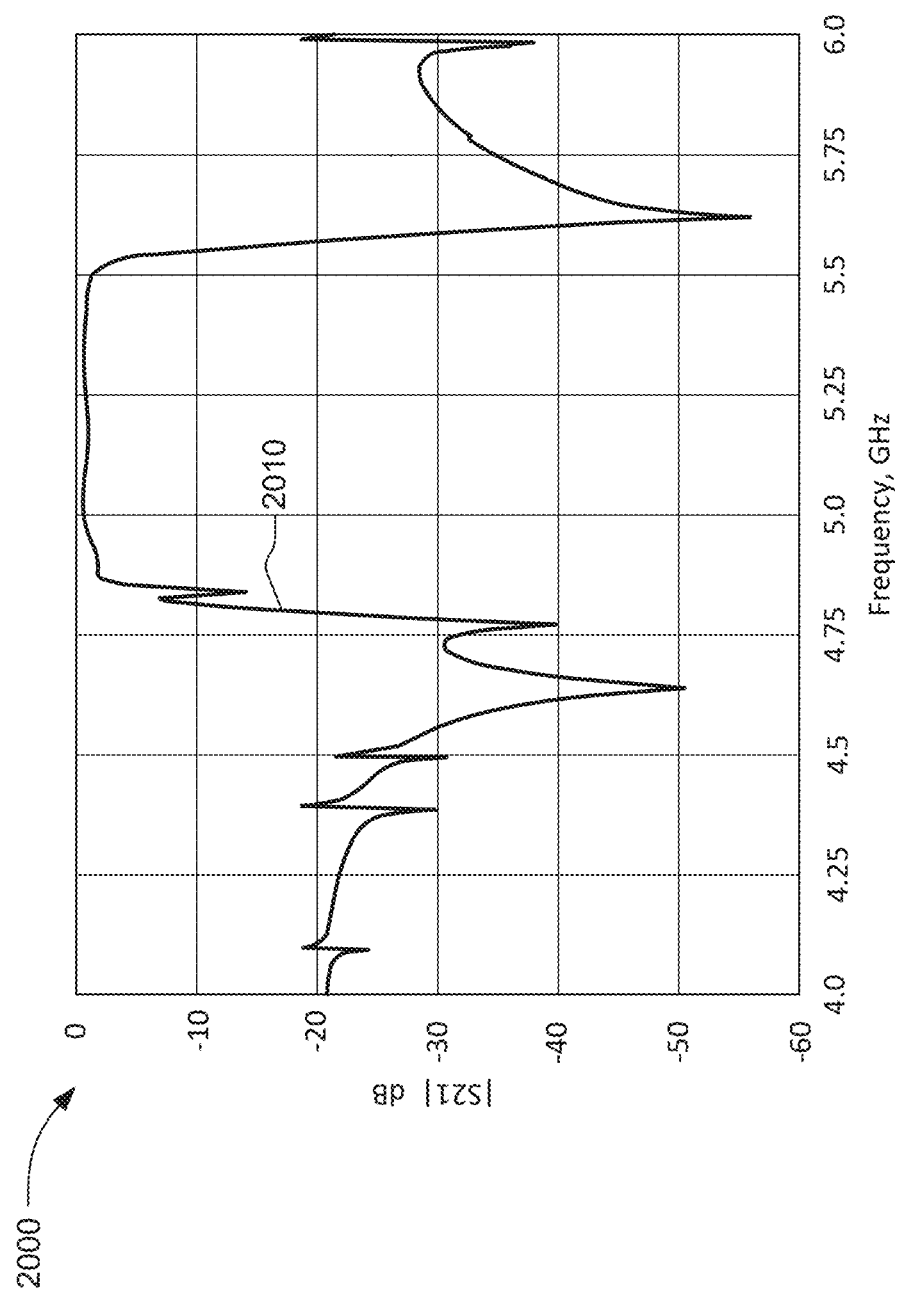
FIG. 20 is a graph of the transfer curve (S21) of an embodiment of the filter of FIG. 12.

FIG. 20 is a chart 2000 showing results from simulating a first bandpass filter incorporating five XBARs. The schematic diagram of the first filter is the same as the filter 1400 of FIG. 14. The XBARs are formed on a 0.4 micron thickness Z-cut lithium niobate plate. The substrate is silicon, the IDT conductors are aluminum, and there are no dielectric layers. The other physical parameters of the resonators are provided in the following table (all dimensions are in microns):

| Parameter | Series Resonators | | | Shunt Resonators | |
|---|---|---|---|---|---|
| | 1410A | 1410B | 1410C | 1420A | 1420B |
| p | 1.475 | 1.475 | 1.525 | 3.52 | 3.52 |
| w | 0.53 | 0.53 | 0.515 | 0.51 | 0.51 |
| AP | 12.8 | 8.6 | 13.8 | 33 | 40 |
| L | 250 | 250 | 250 | 500 | 500 |

The performance of the first filter was simulated using a 3D finite element modeling tool. The curve 2010 is a plot of the magnitude of S21, the input-output transfer function, of the first filter as a function of frequency. The filter bandwidth is about 800 MHz, centered at 5.15 GHz. The simulated filter performance includes resistive and viscous losses. Tuning of the resonant frequencies of the various resonators is accomplished by varying only the pitch and width of the IDT fingers.

Figure 21:
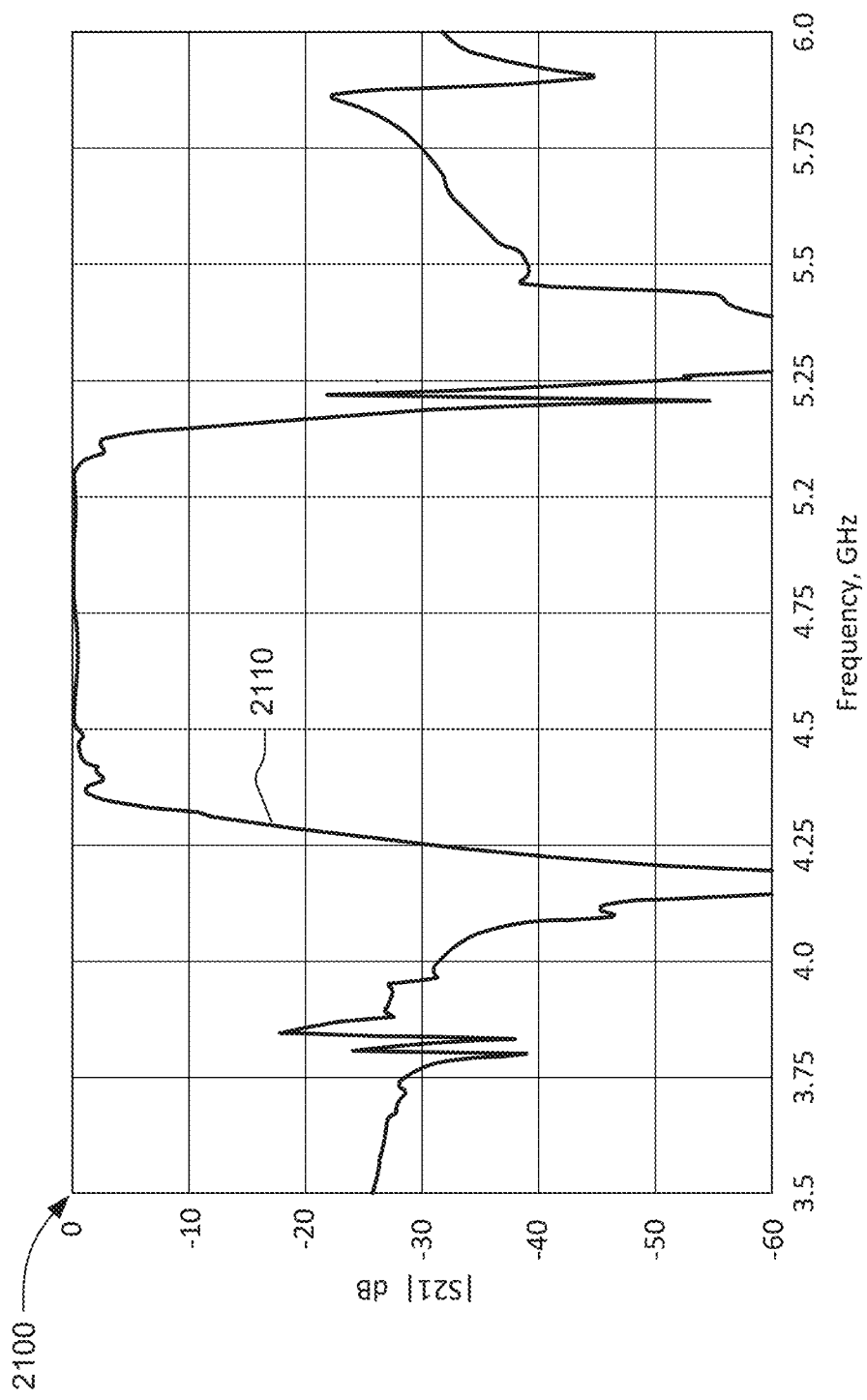
FIG. 21 is a graph of the transfer curve (S21) of another embodiment of the filter of FIG. 12.

FIG. 21 is a chart 2100 showing results from simulating a second filter using five XBARs. The schematic diagram of the second filter is the same as the filter 1400 of FIG. 14. The XBARs are formed on a Z-cut lithium niobate (0.4 μm thick) piezoelectric plate. The substrate is silicon, and the IDT electrodes are copper. Adjusting the resonant frequencies of the resonators is accomplished by varying the pitch and width of the IDT fingers and by providing a frequency-setting dielectric layer on the front side between the IDT fingers of the shunt resonators to reduce their frequencies relative to the frequencies of the series resonators. The other physical parameters of the resonators are provided in the following table (all dimensions are in microns):

| Parameter | Series Resonators | | | Shunt Resonators | |
|---|---|---|---|---|---|
| | 1410A | 1410B | 1410C | 1420A | 1420B |
| p | 4.189 | 4.07 | 4.189 | 4.2 | 4.2 |
| w | 0.494 | 0.505 | 0.494 | 0.6 | 0.6 |
| AP | 46.4 | 23.6 | 46.4 | 80.1 | 80.1 |
| L | 1000 | 1000 | 1000 | 1000 | 1000 |
| tfd | 0 | 0 | 0 | 0.106 | 0.106 |

The performance of the filter was simulated using a 3D finite element modeling tool. The curve 2110 is a plot of S21, the input-output transfer function, of the simulated filter 1400 as a function of frequency. The filter bandwidth is about 800 MHz, centered at 4.75 GHz. The simulated performance does not include resistive or viscous losses.

A first dielectric layer having a first thickness may be deposited over the IDT of the shunt resonators and a second dielectric layer having a second thickness may be deposited over the IDT of the series resonators. The first thickness may be greater than the second thickness. A difference between an average resonance frequency of the series resonators and an average resonance frequency of the shunt resonators is determined, in part, by a difference between the first thickness and the second thickness.

The first and second filters (whose S21 transmission functions are shown in FIG. 21 and FIG. 21) are examples of filters using XBARs. A filter may use more or fewer than two shunt resonators, more or fewer than three series resonators, and more or fewer than five total resonators. A filter may use reactive components, such as capacitors, inductors, and delay lines in addition to XBARs. Further fine tuning of the individual resonators of these filters may improve filter performance.

Figure 15:
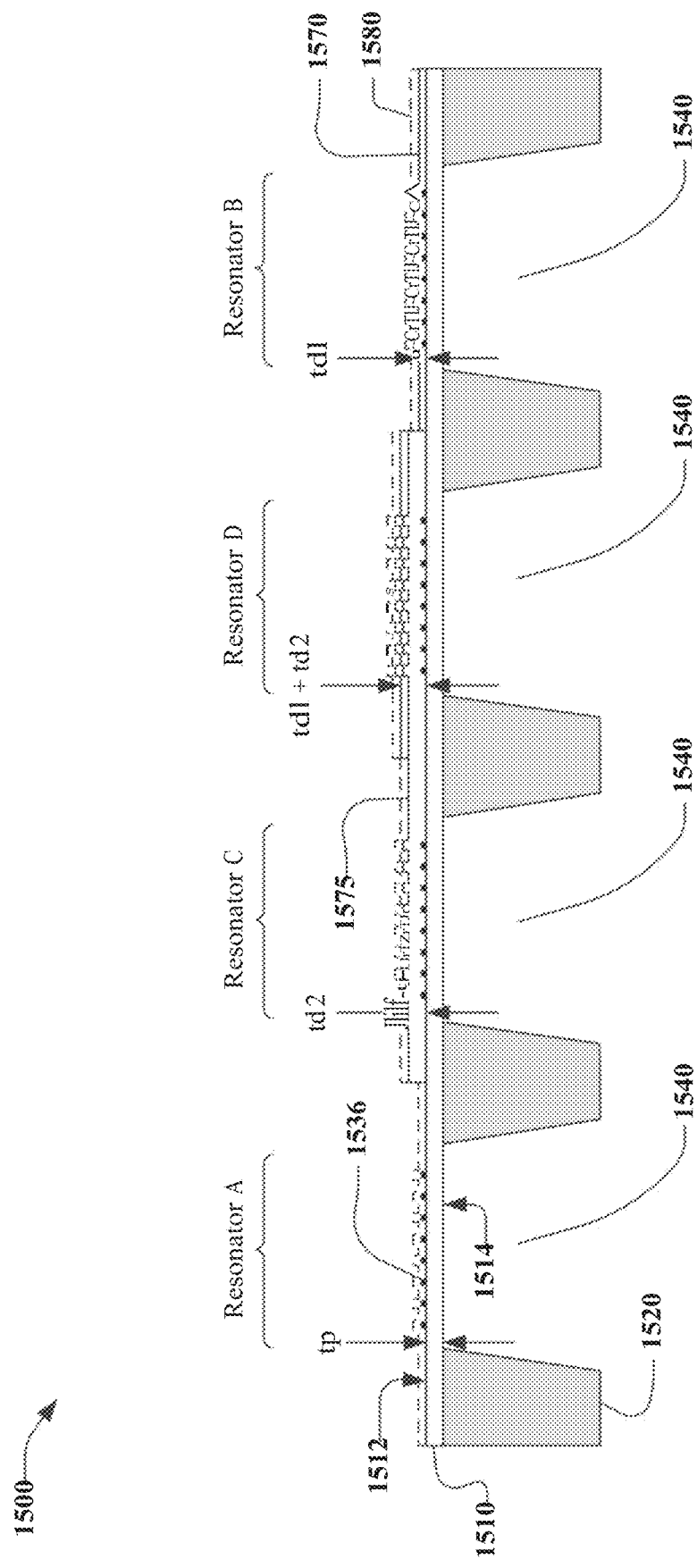
FIG. 15 is a schematic circuit diagram of a filter using XBARs with multiple frequency setting dielectric layers.

FIG. 15 is a schematic cross-sectional view of an improved XBAR filter 500 that uses multiple frequency setting layers. The filter 1500 includes four XBARs identified as Resonator A, Resonator B, Resonator C, and Resonator D. All four resonators are formed on a piezoelectric plate 1510 attached to a substrate 1520. Portions of the piezoelectric plate 1510 are suspended over four cavities 1540 formed in the substrate. While the four cavities 1540 are shown extending through the substrate 1520, the cavities may only extend through a portion of the thickness of the substrate as shown in FIG. 3A. Each of the four resonators A-D includes respective IDT fingers, such as IDT finger 1536 of resonator A, disposed on the top surface 1512 of the piezoelectric plate over the respective cavities.

Resonator A does not include a dielectric frequency setting layer. In this case, the thickness of the diaphragm of resonator A is equal to the thickness tp of the piezoelectric plate 1510. Resonator B has a first frequency setting layer 1570 formed over the IDT fingers 1530. The thickness of the diaphragm of resonator B is equal to tp plus the thickness td1 of the first frequency setting layer. Resonator C has a second frequency setting layer 1575 formed over the IDT fingers 1530. The thickness of the diaphragm of resonator C is equal to tp plus the thickness td2 of the second frequency setting layer. The thickness td2 of the second frequency setting layer is greater than the thickness td1 of the first frequency setting layer. Resonator D includes both the first frequency setting layer 1570 and the second frequency setting layer 1575. The thickness of the diaphragm of resonator D is equal to tp+td1+td2. Since the resonant frequency of an XBAR is highly dependent on diaphragm thickness, the following relationships will usually hold:

$$f_A > f_B > f_C > f_D,$$

where $f_A$, $f_B$, $f_C$, and $f_D$ are the resonance frequencies of resonators A-D, respectively.

The first frequency setting layer 1570 and the second frequency setting layer 1575 may be silicon dioxide, silicon nitride, silicon oxynitride, aluminum oxide, or some other dielectric material with low acoustic loss. The first frequency setting layer 1570 and the second frequency setting layer 1575 are typically, but not necessarily, the same material. All or portions of the first frequency setting layer 1570 and/or the second frequency setting layer 1575 may be formed on the back surface 1514 of the piezoelectric plate 1510.

An optional thin dielectric passivation layer 1580 (shown in dashed lines) may be applied over all of the resonators. If present, the thickness of the passivation layer 1580 may be comparable to or less than the thickness td1 of the first frequency setting layer 1570.

Figure 16:
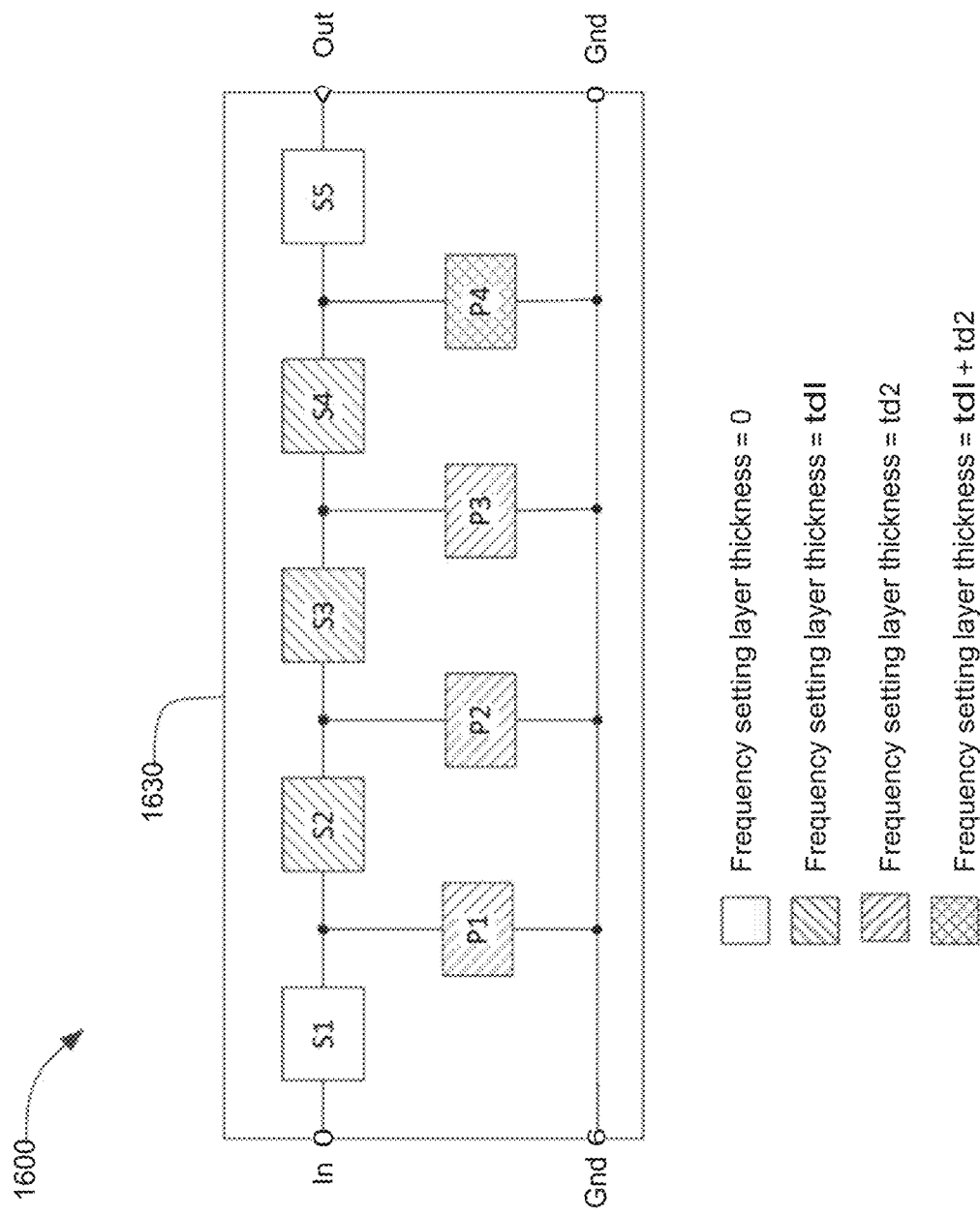
FIG. 16 is a graph of the input-output transfer function (S21) of an embodiment of the filter of FIG. 15.

FIG. 16 is a block diagram of a bandpass filter 1600 including five series resonators S1, S2, S3, S4, and S5 and four shunt (parallel) resonators P1, P2, P3, P4. The bandpass filter 600 is fabricated with two frequency setting layers. A first frequency setting layer having thickness td1 is provided on series resonators S2, S3, and S4 and shunt resonator P4. A second frequency setting layer having thickness td2, which is greater than td1, is provided on the shunt resonators P1 to P4. Series resonators S1 and S5 do not have a frequency setting layer. Shunt resonator P4 has both frequency setting layers.

The structure of series resonators S1 and S5 will be similar to that of Resonator A in FIG. 15. The structure of series resonators S2, S3 and S4 will be similar to that of Resonator B in FIG. 15. The structure of shunt resonators P1, P2, and P3 will be similar to that of Resonator C in FIG. 15. The structure of shunt resonator P4 will be similar to that of Resonator D in FIG. 15.

The inclusion of five series resonators and four shut resonators in the filter 1600 is exemplary, as is the number of resonators that have none, one, or both of the frequency setting layers. In general, the first frequency setting layer will be formed over a first subset of the total number of resonators and the second frequency setting layer will be formed over a second subset of the total number of resonators. In this context, the word "subset" has its conventional meaning of "some but not all". The first and second subsets will not be identical. One or more resonators (e.g., resonator P4 in this example) may belong to both subsets and thus receive both the first and second frequency setting layers. One or more resonators (S1 and S5 in this example) may not belong to either subset. In addition to the first and second frequency setting layers, a passivation layer may be applied over all resonators.

Figure 17:
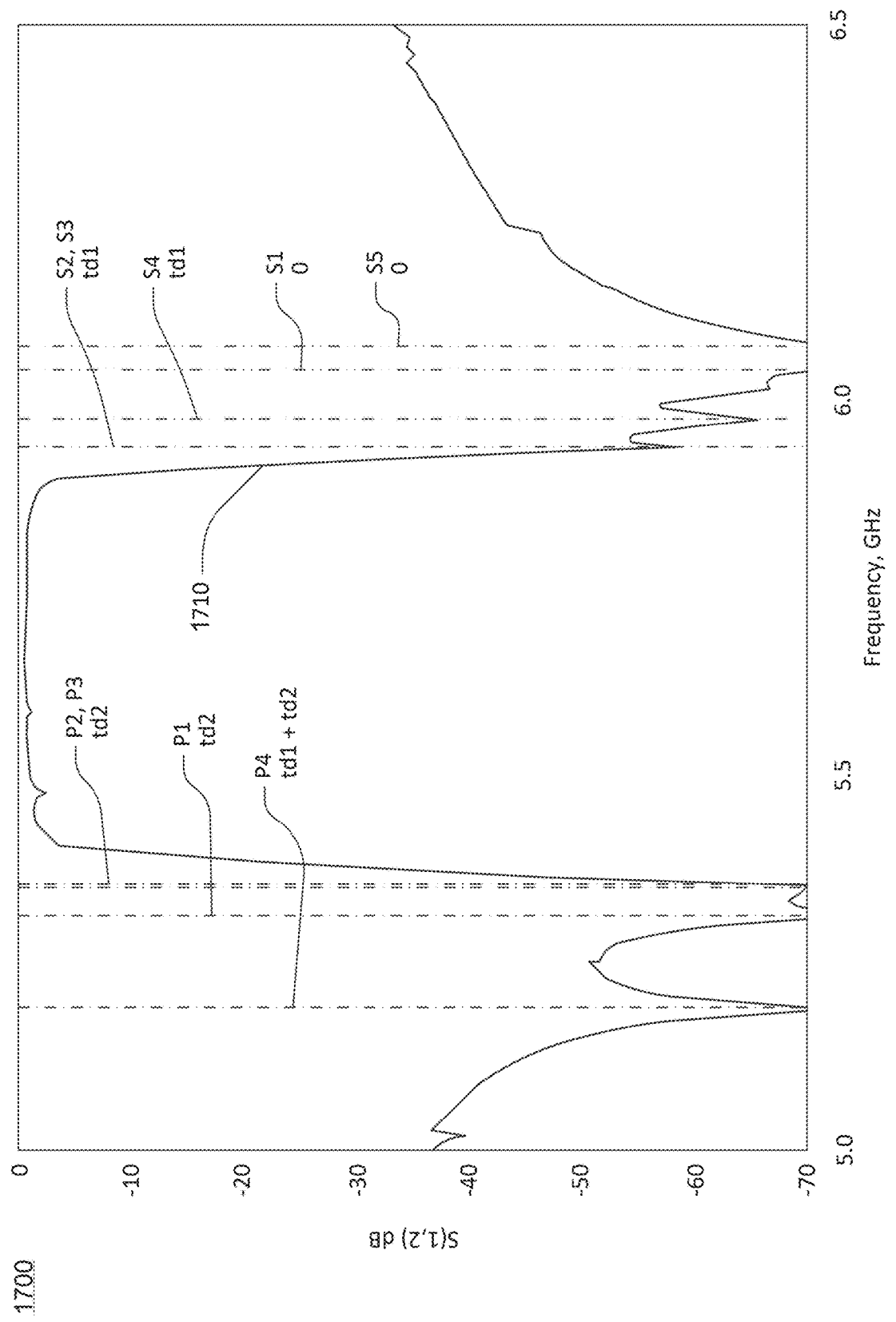
FIG. 17 is a graph of the resonance frequencies of the XBARs in the embodiment of FIG. 16 as a function of IDT pitch with frequency setting dielectric layer thickness as a parameter.

FIG. 17 is a chart showing results from simulating an embodiment of the filter of FIG. 16. The performance of the filter was simulated using a 3D finite element modeling tool. The curve 1710 is a plot of the magnitude of S21, the input-output transfer function, of the filter as a function of frequency. The dot-dash vertical lines represent the transmission zeros at or near the resonance frequencies of the shunt resonators P1, P2, P3, and P4. The dot-dot-dash vertical lines represent the transmission zeros at or near the anti-resonance frequencies of the series resonators S1 to S5. Each of these lines is labeled with the corresponding resonator designator and the thickness of the respective frequency setting dielectric layer.

Figure 18:
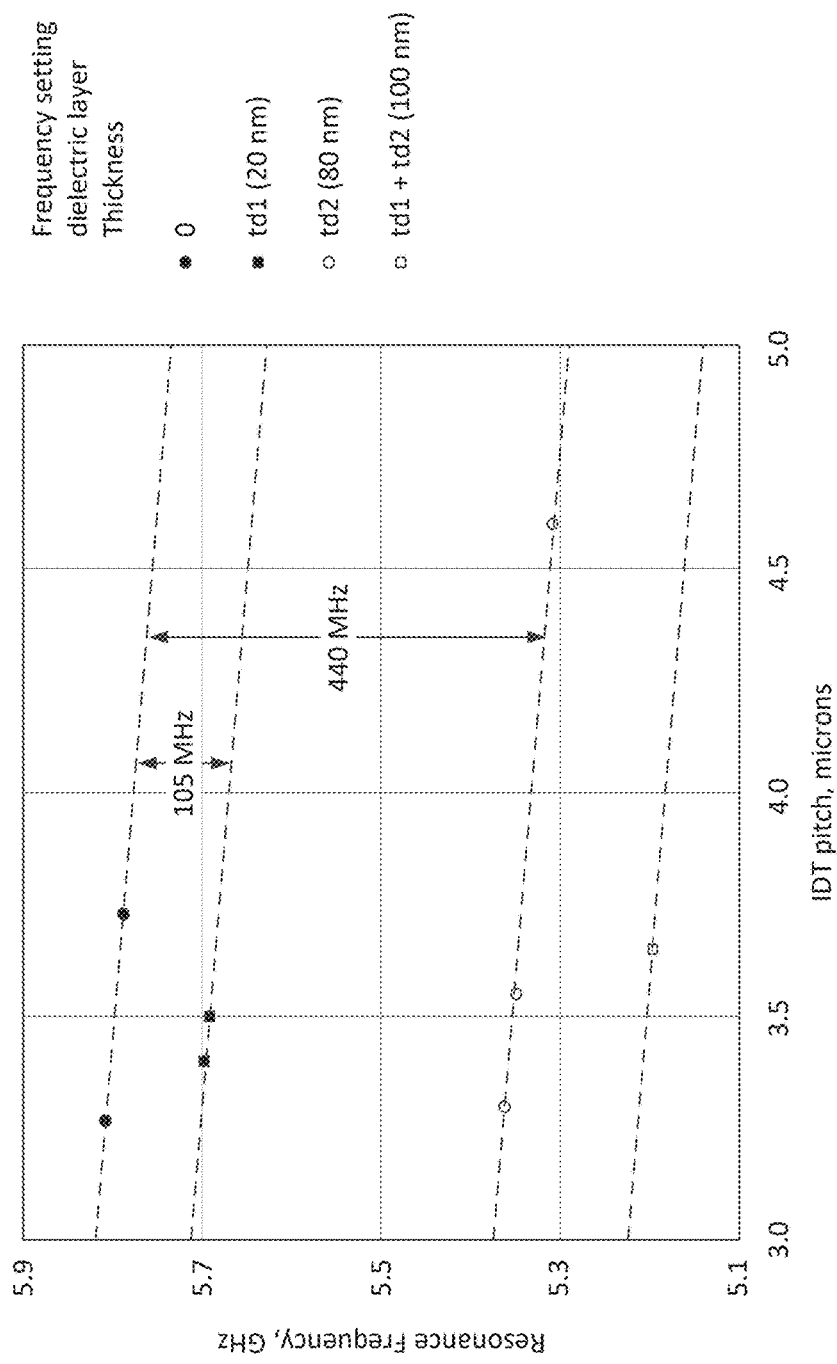
FIG. 18 is a graph of resonance frequency as a function of IDT pitch and frequency setting dielectric layer thickness.

The effect of frequency setting dielectric layers can be understood through consideration of FIG. 18. FIG. 18 is a graph 1800 of the resonance frequencies of the XBARs in the filter 1600 of FIG. 16 as a function of IDT pitch. Solid circles represent resonators without a frequency setting dielectric layer. Solid squares represent resonators with the first frequency setting dielectric layer with thickness td1. Open circles represent resonators with the second frequency setting dielectric layer with thickness td2. The open square represents the resonator with both the first and second frequency setting dielectric layers with a total thickness of td1+td2. In this example td1=20 nm and td2=80 nm. The dashed lines represent the approximate relationships between resonance frequency and IDT pitch for the various dielectric layer thicknesses.

Resonance frequency has a roughly linear dependence on IDT pitch for the IDT pitch range of 3 to 5 microns. However, the dependence is weak, with a 50% change in IDT pitch resulting in roughly 2% change in resonance frequency. Resonance frequency has a stronger dependence on frequency setting dielectric layer thickness. For resonators having the same IDT pitch, the first frequency dielectric layer lowers resonance frequency by about 105 MHz compared to resonators with no dielectric layer. For resonators having the same IDT pitch, the second frequency dielectric layer lowers resonance frequency by about 440 MHz compared to resonators with no dielectric layer.

Figure 19:
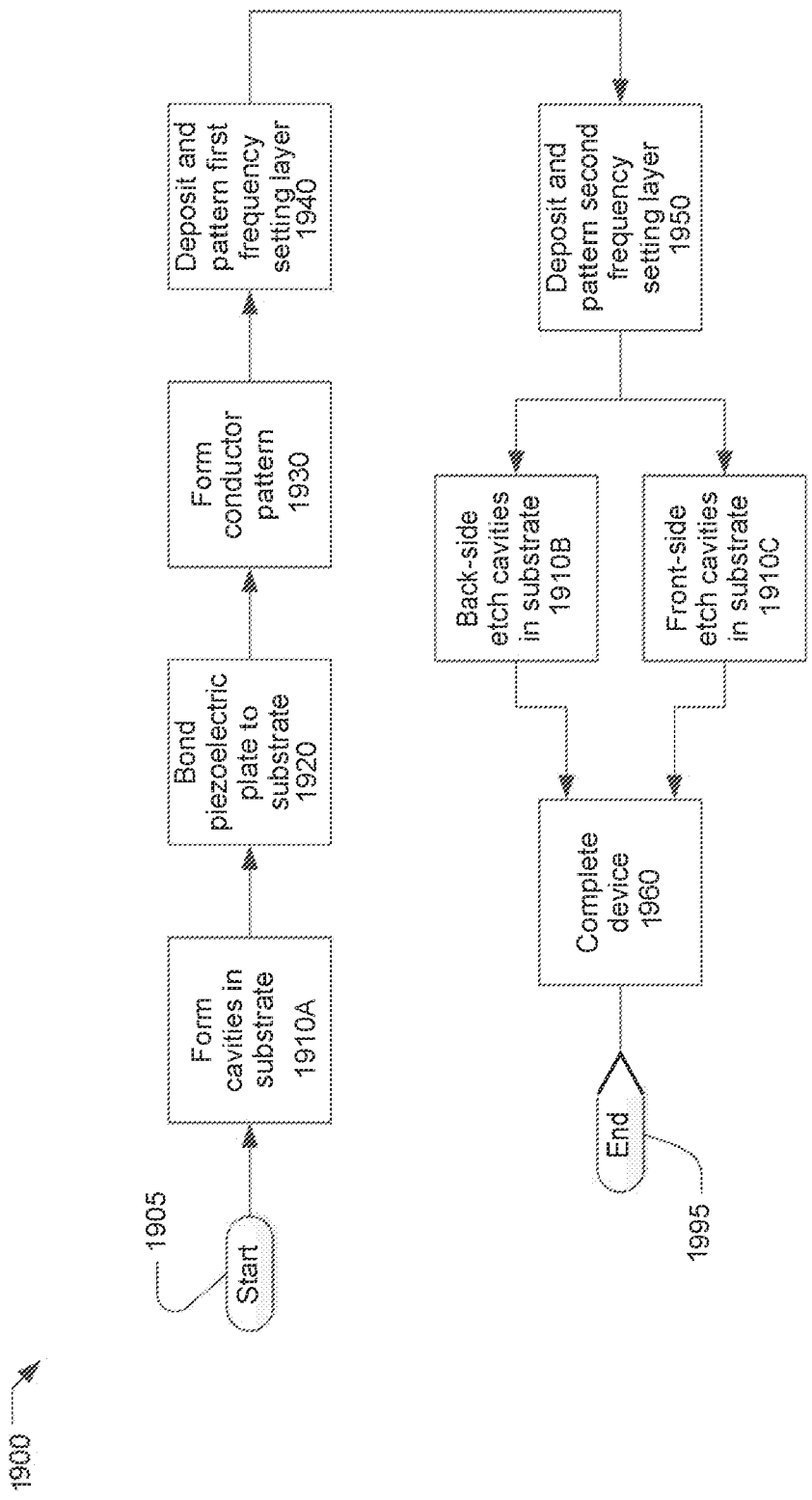
FIG. 19 is a flow chart of a process for fabricating a filter using XBARs with multiple frequency setting dielectric layers.

FIG. 19 is a simplified flow chart showing a process 1900 for making an XBAR or a filter incorporating XBARs. The process 1900 starts at 1905 with a substrate and a plate of piezoelectric material and ends at 1995 with a completed XBAR or filter. The flow chart of FIG. 19 includes only major process steps. Various conventional process steps (e.g., surface preparation, cleaning, inspection, baking, annealing, monitoring, testing, etc.) may be performed before, between, after, and during the steps shown in FIG. 19.

The flow chart of FIG. 19 captures three variations of the process 1900 for making an XBAR which differ in when and how cavities are formed in the substrate. The cavities may be formed at steps 1910A, 1910B, or 1910C. Only one of these steps is performed in each of the three variations of the process 1900.

The piezoelectric plate may be, for example, Z-cut lithium niobate or lithium tantalate as used in the previously presented examples. The piezoelectric plate may be some other material and/or some other cut. The substrate may preferably be silicon. The substrate may be some other material that allows formation of deep cavities by etching or other processing.

In one variation of the process 1900, one or more cavities are formed in the substrate at 1910A before the piezoelectric plate is bonded to the substrate at 1920. A separate cavity may be formed for each resonator in a filter device. The one or more cavities may be formed using conventional photolithographic and etching techniques. Typically, the cavities formed at 1910A will not penetrate through the substrate, and the resulting resonator devices will have a cross-section as shown in FIG. 3A.

At 1920, the piezoelectric plate is bonded to the substrate. The piezoelectric plate and the substrate may be bonded by a wafer bonding process. Typically, the mating surfaces of the substrate and the piezoelectric plate are highly polished. One or more layers of intermediate materials, such as an oxide or metal, may be formed or deposited on the mating surface of one or both of the piezoelectric plate and the substrate. One or both mating surfaces may be activated using, for example, a plasma process. The mating surfaces may then be pressed together with considerable force to establish molecular bonds between the piezoelectric plate and the substrate or intermediate material layers. The piezoelectric plate may be bonded to the substrate using some other technique.

A conductor pattern, including IDTs of each XBAR in the filter, is formed at 1930 by depositing and patterning one or more conductor layers on the front side of the piezoelectric plate. The conductor layer may be, for example, aluminum, an aluminum alloy, copper, a copper alloy, or some other conductive metal. Optionally, one or more layers of other materials may be disposed below (i.e., between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1930 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1930 using a lift-off process. Photoresist may be deposited over the piezoelectric plate and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1940, the first frequency setting dielectric layer may be formed by depositing a dielectric material on the front side of the piezoelectric plate. The first frequency setting dielectric layer may be deposited using a conventional deposition technique such as atomic layer deposition, physical vapor deposition, or chemical vapor deposition. One or more lithography processes (using photomasks) may be used to limit the first frequency setting dielectric layer to selected areas of the piezoelectric plate, such as only over the fingers of a first subset of IDTs. The thickness of the first frequency setting dielectric layer is $td1$.

At 1950, the second frequency setting dielectric layer may be formed by depositing a dielectric material on the front side of the piezoelectric plate. The second frequency setting dielectric layer may be deposited using a conventional deposition technique such as atomic layer deposition, physical vapor deposition, or chemical vapor deposition. One or more lithography processes (using photomasks) may be used to limit the second frequency setting dielectric layer to selected areas of the piezoelectric plate, such as only over the fingers of a second subset of IDTs. The thickness of the second frequency setting dielectric layer is $td2$. Typically, $td2 > td1$.

In a second variation of the process 1900, one or more cavities are formed in the back side of the substrate at 1910B. A separate cavity may be formed for each resonator in a filter device. The one or more cavities may be formed using an anisotropic or orientation-dependent dry or wet etch to open holes through the back side of the substrate to the piezoelectric plate. In this case, the resulting resonator devices will have a cross-section as shown in FIG. 1.

In a third variation of the process 1900, one or more cavities in the form of recesses in the substrate may be formed at 1910C by etching the substrate using an etchant introduced through openings in the piezoelectric plate. A separate cavity may be formed for each resonator in a filter device. The one or more cavities formed at 1910C will not penetrate through the substrate, and the resulting resonator devices will have a cross-section as shown in FIG. 3A.

In all variations of the process 1900, the filter device is completed at 1960. Actions that may occur at 1960 include depositing an encapsulation/passivation layer such as silicon oxide or silicon nitride over all or a portion of the device; forming bonding pads or solder bumps or other means for making connection between the device and external circuitry; excising individual devices from a wafer containing multiple devices; other packaging steps; and testing. Another action that may occur at 1960 is to tune the resonant frequencies of the resonators within the device by adding or removing metal or dielectric material from the front side of the device. After the filter device is completed, the process ends at 1995.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A filter device comprising:
   a substrate including a base and an intermediate layer;
   a piezoelectric layer attached to a surface of the substrate, portions of the piezoelectric layer forming one or more diaphragms that are over respective cavities in the intermediate layer;
   a conductor pattern on a surface of the piezoelectric layer, the conductor pattern including a plurality of interdigital transducers (IDTs) of a plurality of resonators, interleaved fingers of each of the plurality of IDTs disposed on a respective diaphragm of the one or more diaphragms;
a first dielectric layer having a first thickness disposed on and between the interleaved fingers of the IDTs of a first subset of the plurality of resonators; and
a second dielectric layer having a second thickness greater than the first thickness disposed on and between the interleaved fingers of the IDTs of a second subset of the plurality of resonators, wherein the first subset and the second subset are not identical to each other,
wherein each IDT comprises a first busbar, a second busbar, and interleaved fingers extending alternately from the first and second busbars, wherein overlapping portions of the interleaved fingers are disposed on the respective diaphragm, and at least portions of both the first and second busbars are disposed on a supported portion of the piezoelectric layer that does not form part of the diaphragm.

2. The filter device of claim 1, wherein the piezoelectric layer and all of the IDTs are configured such that a respective radio frequency signal applied to each IDT excites a respective primarily shear acoustic mode within the respective diaphragm, wherein shear deformation is introduced by a lateral electric field in a substantially lateral direction of atomic motion, while propagation of a bulk shear wave of the shear acoustic mode is normal to the substantially lateral direction of atomic motion and also substantially normal to the surface of the piezoelectric layer.

3. The filter device of claim 1, wherein the plurality of resonators includes two or more shunt resonators and two or more series resonators connected to form a ladder filter circuit, and the second subset is all of the shunt resonators.

4. The filter device of claim 3, wherein the first subset includes at least one of the two or more series resonator.

5. The filter device of claim 1, further comprising a back-side dielectric layer on the surface of the piezoelectric layer facing the substrate, wherein the back-side dielectric layer for each subset is a different thickness than the either the first frequency setting dielectric layer or the second frequency setting dielectric layer.

6. The filter device of claim 1, further comprising a passivation layer disposed over all of the plurality of resonators.

7. The filter device of claim 1, wherein the plurality of resonators includes two or more series resonators, and the second dielectric layer is on the surface of the piezoelectric layer between the interleaved fingers of all of the two or more series resonators.

8. A filter device, comprising:
a substrate including a base and an intermediate layer;
a piezoelectric layer having front and back surfaces, the back surface attached either directly or via one or more intermediate layers to a surface of a substrate, portions of the piezoelectric layer forming one or more diaphragms that are over respective cavities in the intermediate layer;
a conductor pattern on the front surface, the conductor pattern including a plurality of interdigital transducers (IDTs) of a respective plurality of acoustic resonators including a shunt resonator and a series resonator, interleaved fingers of each of the plurality of IDTs on a diaphragm of the one or more diaphragms;
a first dielectric layer having a first thickness over the IDT of the shunt resonator, and
a second dielectric layer having a second thickness over the IDT of the series resonator,
wherein:
the piezoelectric layer and all of the plurality of IDTs are configured such that radio frequency signals applied to the plurality of IDTs excite respective primarily shear acoustic modes within the one or more diaphragms, and
the first thickness is greater than the second thickness;
wherein each IDT comprises a first busbar, a second busbar, and interleaved fingers extending alternately from the first and second busbars, and
wherein overlapping portions of the interleaved fingers are disposed on the respective diaphragm, and at least portions of both the first and second busbars are disposed on a supported portion of the piezoelectric layer that does not form part of the diaphragm.

9. The filter device of claim 8, wherein the conductor pattern comprises one of aluminum, an aluminum alloy, copper, a copper alloy, beryllium, and gold.

10. The filter device of claim 8, wherein:
the plurality of resonators includes two or more shunt resonators, and the first dielectric layer is over the IDTs of all of the two or more shunt resonators, and
the plurality of resonators includes two or more series resonators, and the second dielectric layer is over the IDTs of all of the two or more series resonators.

11. The filter device of claim 1, wherein:
the plurality of resonators comprises a third subset of the plurality of resonators, and
a third dielectric layer is disposed over the interleaved fingers of the IDTs of the third subset of the plurality of resonators and has a different thickness than either of the first thickness and the second thickness.

12. The filter device of claim 8, wherein a difference between a resonance frequency of the series resonator and a resonance frequency of the shunt resonator is determined, in part, by a difference between the first thickness and the second thickness.

13. The filter device of claim 8, wherein the first thickness is less than or equal to 500 nm, and the second thickness is greater than or equal to zero.

14. The filter device of claim 8, wherein respective directions of acoustic energy flow of each of the excited primary shear acoustic modes are substantially normal to the surfaces of the piezoelectric layer, and substantially normal to a lateral direction of an electric field of the primary shear acoustic mode.

15. The filter device of claim 8, wherein a thickness between the front and back surfaces of the piezoelectric layer is greater than or equal to 200 nm and less than or equal to 1000 nm.

16. The filter device of claim 15, wherein each of the plurality of IDTs has a respective pitch greater than or equal to 2 times the thickness of the piezoelectric layer and less than or equal to 25 times the thickness of the piezoelectric layer.

17. The filter device of claim 8, wherein the first and second dielectric layers comprise at least one of silicon dioxide and silicon nitride.

18. A filter device comprising:
a substrate;
a piezoelectric layer attached either directly or via one or more intermediate layers to the substrate, the piezoelectric layer including one or more diaphragms that are over respective cavities of the filter device; and
a conductor pattern on a surface of the piezoelectric layer, the conductor pattern including a plurality of interdigital transducers (IDTs) of a plurality of resonators, each IDT of the plurality of IDTs including a first busbar, a second busbar, and interleaved fingers extending alternately from the first and second busbars, wherein overlapping portions of the interleaved fingers of each IDT are disposed on a respective diaphragm of the one or more diaphragms;

wherein a first subset of the plurality of resonators comprises a first frequency setting dielectric layer having a first thickness, wherein a second subset of the plurality of resonators includes a second frequency setting dielectric layer having a second thickness greater than the first thickness, and wherein the plurality of resonators comprises a third subset of the plurality of resonators, and a third frequency setting layer is disposed over interleaved fingers of the IDTs of the third subset of the plurality of resonators and has a combined thickness of both the first thickness and the second thickness.

19. The filter device of claim 18, wherein at least portions of both the first and second busbars of each IDT are disposed on a supported portion of the piezoelectric layer that does not include part of the one or more diaphragms.

* * * * *